(12) United States Patent
Greene

(10) Patent No.: US 9,438,319 B2
(45) Date of Patent: Sep. 6, 2016

(54) METHOD AND APPARATUS FOR ANTENNA SELECTION

(71) Applicant: BlackBerry Limited, Waterloo (CA)

(72) Inventor: Matthew Russell Greene, Crystal Lake, IL (US)

(73) Assignee: BlackBerry Limited, Waterloo, ON (CA)

( * ) Notice: Subject to any disclaimer, the term of this patent is extended or adjusted under 35 U.S.C. 154(b) by 0 days.

(21) Appl. No.: 14/571,928

(22) Filed: Dec. 16, 2014

(65) Prior Publication Data

US 2016/0173172 A1 Jun. 16, 2016

(51) Int. Cl.
*H04M 1/00* (2006.01)
*H04B 7/04* (2006.01)
*H01Q 21/00* (2006.01)
*H03H 7/40* (2006.01)
*H04W 24/10* (2009.01)
*H04B 7/06* (2006.01)
*H04B 7/08* (2006.01)

(52) U.S. Cl.
CPC ........ *H04B 7/0404* (2013.01); *H01Q 21/0006* (2013.01); *H03H 7/40* (2013.01); *H04B 7/0608* (2013.01); *H04B 7/0802* (2013.01); *H04W 24/10* (2013.01)

(58) Field of Classification Search
CPC .................................................. H04B 7/0602
USPC .................................. 455/101, 277.2, 562.1
See application file for complete search history.

(56) References Cited

U.S. PATENT DOCUMENTS

| 6,125,266 A | 9/2000 | Matero et al. |
| 7,528,674 B2 | 5/2009 | Kato et al. |
| 7,705,692 B2 | 4/2010 | Fukamachi et al. |
| 7,907,094 B2 | 3/2011 | Kakitsu et al. |

(Continued)

FOREIGN PATENT DOCUMENTS

| CN | 101640949 A | 2/2010 |
| DE | 102009018648 A1 | 10/2010 |
| WO | 2010121914 A1 | 10/2010 |

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

*Primary Examiner* — Hsin-Chun Liao
(74) *Attorney, Agent, or Firm* — Guntin & Gust, PLC; Ralph Trementozzi

(57) ABSTRACT

A system that incorporates teachings of the subject disclosure may include, for example, an antenna system coupled with the transceiver that includes a first antenna and a second antenna where one of the first or second antennas is operating as a primary antenna and the other of the first or second antennas is operating as a diversity antenna. The system can include an RF switch connected with the antenna system, where the RF switch has a first position in which the first antenna is the primary antenna and the second antenna is the diversity antenna, and wherein the RF switch has a second position in which the second antenna is the primary antenna and the first antenna is the diversity antenna. The system can include a controller coupled with the matching network and with the RF switch, where the controller receives first reflection measurements associated with the antenna system, and where the controller adjusts the RF switch to select between the first and second positions according to the first reflection measurements.

17 Claims, 27 Drawing Sheets

(56) References Cited

U.S. PATENT DOCUMENTS

| | | | |
|---|---|---|---|
| 7,940,223 B2 * | 5/2011 | Dou | H01Q 21/28 343/702 |
| 8,320,850 B1 | 11/2012 | Khlat | |
| 8,432,234 B2 | 4/2013 | Manssen et al. | |
| 8,774,743 B2 | 7/2014 | Ali et al. | |
| 2002/0183013 A1 | 12/2002 | Auckland et al. | |
| 2004/0009754 A1 | 1/2004 | Smith, Jr. | |
| 2004/0232982 A1 | 11/2004 | Ichitsubo et al. | |
| 2004/0264610 A1 | 12/2004 | Marro et al. | |
| 2006/0022882 A1 * | 2/2006 | Gerder | H01Q 1/273 343/718 |
| 2006/0195161 A1 | 8/2006 | Li et al. | |
| 2007/0093282 A1 | 4/2007 | Chang et al. | |
| 2008/0055168 A1 | 3/2008 | Massey et al. | |
| 2008/0111748 A1 | 5/2008 | Dunn et al. | |
| 2008/0261544 A1 | 10/2008 | Blin | |
| 2009/0121963 A1 | 5/2009 | Greene | |
| 2009/0231220 A1 | 9/2009 | Zhang et al. | |
| 2010/0053009 A1 | 3/2010 | Rofougaran | |
| 2010/0073103 A1 | 3/2010 | Spears et al. | |
| 2010/0285836 A1 | 11/2010 | Horihata et al. | |
| 2010/0304684 A1 | 12/2010 | Duron et al. | |
| 2011/0249760 A1 | 10/2011 | Chrisikos et al. | |
| 2012/0112851 A1 * | 5/2012 | Manssen | H03H 7/40 333/101 |
| 2012/0112970 A1 | 5/2012 | Mow et al. | |
| 2012/0139810 A1 | 6/2012 | Faraone et al. | |
| 2012/0295555 A1 | 11/2012 | Greene et al. | |
| 2013/0194054 A1 | 8/2013 | Presti | |
| 2013/0231155 A1 | 9/2013 | Sheynman et al. | |
| 2013/0265912 A1 | 10/2013 | Ikonen et al. | |
| 2014/0009360 A1 | 1/2014 | Ikonen et al. | |
| 2014/0162572 A1 | 6/2014 | Hirabayashi | |
| 2014/0210686 A1 | 7/2014 | Ali et al. | |
| 2014/0287698 A1 | 9/2014 | Ali et al. | |

* cited by examiner

200

600

| CL table | | | (Main Antenna) | | NEW | | | | | |
|---|---|---|---|---|---|---|---|---|---|---|
| UseCase DxV1 DxV2 DxV3 | | | RealInd ImagInd | | RealIndSW ImagIndSW | | RxV1 RxV2 RxV3 | | | SwAnt |
| 1 | 16.56 | 5.65 | 0 | 7.54 | 1.48 | 7.5 | 1.5 | 7.72 | 19.95 | 0 | 1 |
| 2 | 7.53 | 19.95 | 0 | 7.3 | 6.07 | 7.3 | 6.1 | 7.34 | 4.52 | 0 | 2 |
| 3 | 15.15 | 14.17 | 0 | 6.78 | 1.93 | 6.8 | 1.9 | 2.07 | 11.11 | 0 | 1 |
| 4 | 15.15 | 19.95 | 0 | 6.23 | 2.38 | 6.2 | 2.4 | 2.07 | 19.95 | 0 | 1 |
| 5 | 2.07 | 19.95 | 0 | 4.24 | 5.74 | 4.2 | 5.7 | 5.08 | 2.07 | 0 | 2 |
| 6 | 7.34 | 2.07 | 0 | 9.51 | 11.82 | 9.5 | 11.8 | 10.54 | 2.07 | 0 | 2 |

Duplex DACs | Grid indices for State 0 | Grid indices to identify use case for Antenna Selection (Can be updated by CL testing in lab) 8.8 format in LUT | RX DACs | 1=prefer Tx on Ant1 2=prefer Tx on Ant2

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| Band N; Use Case 1; Desired tuning state |
| Band N; Use Case 2; Desired tuning state |
| ⋮ |
| Band N; Use Case n; Desired tuning state |

METHOD AND APPARATUS FOR ANTENNA SELECTION

FIELD OF THE DISCLOSURE

The subject disclosure relates to communication devices and, in particular, selection of an antenna in an antenna system.

BACKGROUND

Wireless communication devices can operate over a wide range of frequencies such as from 700 to 2700 MHz. Antenna design is made more challenging by handset requirements that include long battery life, more frequency bands, larger display screens with reduced borders, and thinner form factors.

Communication devices such as cellular telephones, tablets, and laptops can support multi-cellular access technologies, peer-to-peer access technologies, personal area network access technologies, and location receiver access technologies, which can operate concurrently. Communication devices have also integrated a variety of consumer features such as MP3 players, color displays, gaming applications, cameras, and other features.

Communication devices can be required to communicate at a variety of frequencies, and in some instances are subjected to a variety of physical and functional use conditions. For instance, when handling the communication device, a user may detune the antenna and/or affect its radiation efficiency by the users grip, body, or other materials around the communication device.

BRIEF DESCRIPTION OF THE DRAWINGS

Reference will now be made to the accompanying drawings, which are not necessarily drawn to scale, and wherein:

FIGS. 14-15 depict graphical representations of tuning data utilized for antenna selection in the method of FIG. 13;

FIG. 23 depicts an illustrative embodiment of a look-up table utilized by the communication device of FIG. 1 for controlling tunable reactive elements and antenna selection utilized by the communication device;

DETAILED DESCRIPTION

Figure 1:
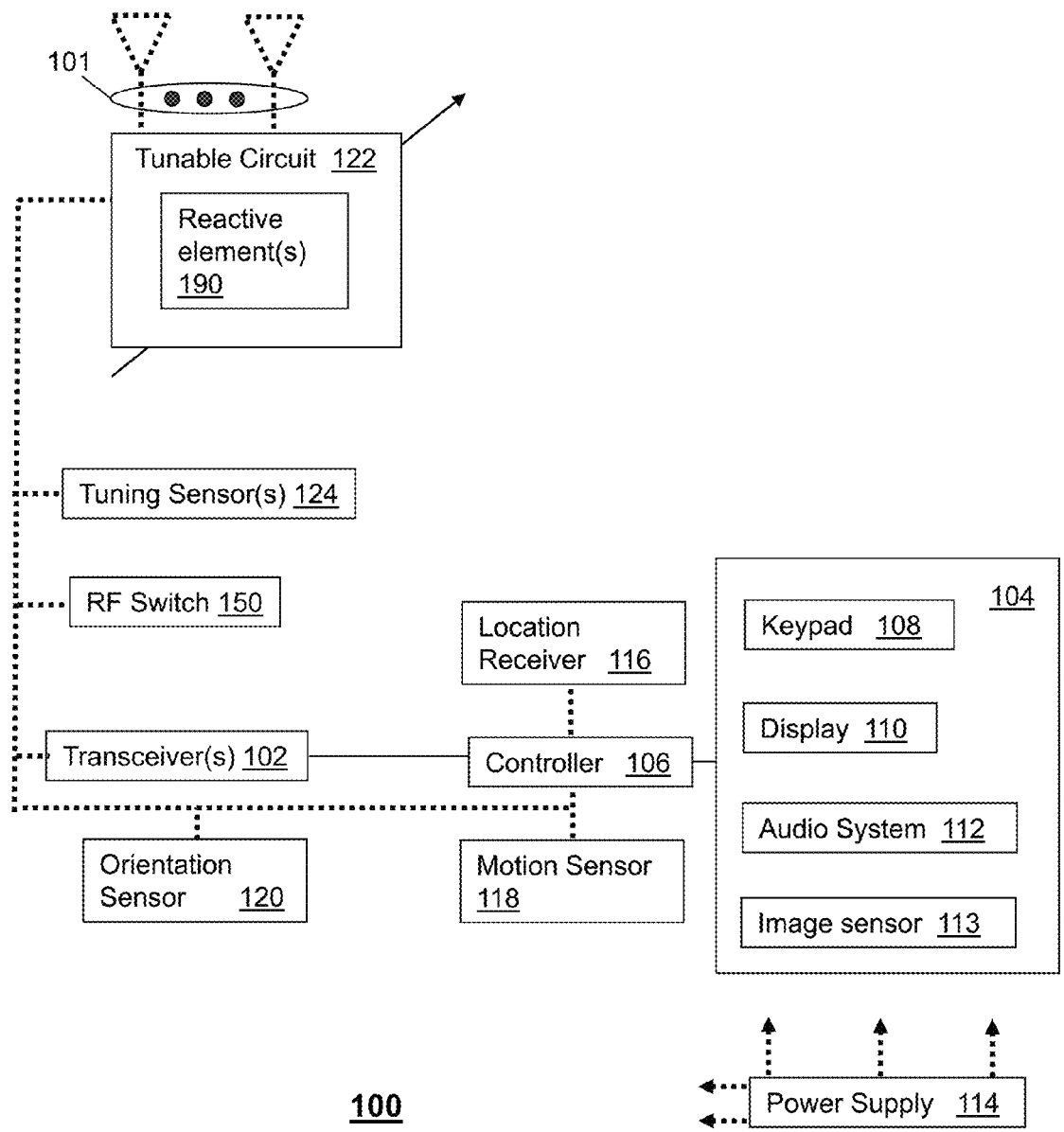
FIGS. 1 and 2 depict illustrative embodiments of communication devices that provide antenna selection to improve radiation efficiency.

The subject disclosure describes, among other things, illustrative embodiments of devices that selectively switch antennas operating as primary and diversity antennas. The antenna selection can be based on various factors including measuring operating parameters (e.g., reflection measurements). In one or more embodiments, the reflection measurements can be used for determining a use case of the communication device and determining a preferred or desired antenna to operate as the primary antenna according to the use case. The use case can be a positioning of the communication device with respect to the user such as Beside Head and Hand Right (BHHR) or Beside Head and Hand Left (BHHL). The use case can also include a physical state of the communication device, such as open flip or closed flip for a flip phone. The use case can also include a functional state of the communication device, such as speaker phone or Bluetooth operation.

In one or more embodiments, selective antenna switching can be utilized in conjunction with impedance tuning for one or both of the primary and diversity antenna. The particular number of antennas utilized can be just two or can be more than two antennas. In one or more embodiments, the same measured parameter(s) can be used for both the selective antenna switching and the impedance tuning, such as reflection measurements. The impedance tuning can be a closed loop feedback process and/or an open loop feedback process.

In one embodiment, a sense integrated circuit (IC) can perform or otherwise obtain reflection measurements that are used as feedback for closed loop antenna tuning. A Double Pole Double Throw switch (DPDT) switch can be utilized for antenna selection, so that the transmitter can be routed to the antenna that has the most favorable loading conditions for radiation. The reflection measurements from the sense IC can be used to determine the loading conditions of each antenna and can be used as the selection criteria for the antenna selection.

In one embodiment, transmission Gamma measurements can be utilized for antenna selection according to a tuning grid. A grid location determined by a closed-loop tuning algorithm can be used as an input for antenna selection. For example, each grid location in a lookup table can have an entry for efficiency. The grid location can be determined by coarse tune. In one embodiment, the grid location can be further refined using fine tune. In one embodiment, a metric can be a distance from the grid location to freespace antenna S11. In another embodiment, instead of using the algorithm-derived grid location, measurements (e.g., from the sense IC) can be directly utilized.

In one embodiment, a selection criteria can be based solely on measurements with the antenna currently connected to the transmitter, rather than requiring measurements for both antennas. In another embodiment, the antenna switching is subject to control by the modem such as a controller indicating to the modem (e.g., according to reflection measurements) which antenna is preferred for transmitting while the modem indicates to the control which antenna is transmitting. In one example, the reflection measurements that are utilized to determine whether or not to switch antennas can be limited to the antenna that is currently transmitting. In one embodiment, the monitoring of the reflection measurements and assessment as to the preferred antenna can continue to be executed while the controller is waiting for permission from the modem to switch antennas.

In one or more embodiments, the antenna selection systems and processes described herein can be utilized with or without impedance tuning. Where impedance tuning is utilized, it can be based on the same operational parameter(s) as is used in the antenna selection process or can be based on different operational parameter(s). The impedance tuning can be for one, some or all of the antennas being utilized by the communication device. As an example, different tunable reactive elements can be utilized for impedance tuning of different antennas or the same tunable reactive element can be used for impedance tuning of some or all of the antennas.

In one or more embodiments, closed loop tuning on both antennas can be performed by toggling an antenna selection switch to perform reflection measurements for tuning algorithm. In these examples, the modem permits frequent antenna switching.

In one embodiment utilizing voltage variable tuning and antenna selection, the communication device can efficiently operate over a wide frequency range such as of 700 to 960 (LB), 1700 to 2200 MHz (MB) and 2300-2700 MHz (HB). The exemplary embodiments can improve antenna efficiency and radiation efficiency while also enabling selection of the more efficient antenna for transmission. Antenna efficiency is essentially the ratio (e.g., in % or dB) of total power radiating out of the antenna divided by total power injected into the antenna. Radiation efficiency is the ratio of "calculated total power radiated out of the antenna if no power was lost due to mismatch", divided by total power injected into the antenna. The latter, radiation efficiency, can be a better measure of the antenna's ability to radiate, and a better measure of how much power is lost as dissipative energy, either in the ohmic losses in the antenna/phone device, or if in use case, into the user.

In one or more embodiments, the primary and diversity antennas can include parallel coupled radiating elements for LB and for MB and HB communications. In another embodiment, the antennas can be set on or in proximity to the bottom (or the top) of the wireless devices (e.g., a mobile phone). In one or more embodiments, single feed antennas can be utilized. In one or more embodiments, high antenna efficiency and high radiation efficiency for tunable matching applications can be provided. In one or more embodiments, a small dimension in the y direction can be utilized, which is suitable for a small ground clearance device which enables larger screens and/or larger batteries without making the device overall dimensions larger.

In one or more embodiments, low ground clearance can be utilized. In one or more embodiments, good antenna performance can be provided, such as in BHHR for primary and in BHHL for diversity. In one or more embodiments, low antenna pattern correlation coefficients can be provided.

One or more of the exemplary embodiments can be utilized in multi-antenna and/or multi-port antenna systems used to address Carrier Aggregation (CA) requirements for handsets, such as LB antennas that must cover 700-960 MHz under all use-cases. Other embodiments are described by the subject disclosure.

One embodiment of the subject disclosure includes a mobile communication device having a transceiver, an antenna system, an RF switch, a matching network, and a controller. The antenna system is coupled with the transceiver, where the antenna system includes a first antenna and a second antenna, and where one of the first or second antennas is operating as a primary antenna and the other of the first or second antennas is operating as a diversity antenna. The RF switch is connected with the antenna system, where the RF switch has a first position in which the first antenna is the primary antenna and the second antenna is the diversity antenna, and where the RF switch has a second position in which the second antenna is the primary antenna and the first antenna is the diversity antenna. The matching network is coupled with the transceiver and the antenna system, wherein the matching network comprises a tunable reactive element. The controller is coupled with the matching network and with the RF switch, where the controller receives first reflection measurements associated with the antenna system, where the controller adjusts the tunable reactive element according to the first reflection measurements to provide impedance tuning, and where the controller adjusts the RF switch to select between the first and second positions according to the first reflection measurements.

One embodiment of the subject disclosure is a method that includes obtaining, by a controller of a communication device, first reflection measurements for a first antenna of the communication device operating as a primary antenna when an RF switch of the communication device is in a first position. The method includes adjusting, by the controller, a tunable reactive element of a matching network according to the first reflection measurements to perform impedance tuning. The method includes analyzing, by the controller, the first reflection measurements to determine a desired antenna for transmission. The method includes switching, by the controller, the RF switch to a second position responsive to a determination that a second antenna of the communication device is the desired antenna for transmission, where the switching to the second position causes the second antenna to operate as the primary antenna. The method includes obtaining, by the controller, second reflection measurements for the second antenna operating as the primary antenna when the RF switch is in the second position. The method includes adjusting, by the controller, the tunable reactive element according to the second reflection measurements to perform the impedance tuning. The method includes analyzing, by the controller, the second reflection measurements to determine the desired antenna for transmission. The method includes switching, by the controller, the RF switch to the first position responsive to a determination that the first antenna is the desired antenna for transmission.

One embodiment of the subject disclosure is a communication device that includes a modem, a transceiver, an antenna system, an RF switch and a controller. The antenna system is coupled with the transceiver, where the antenna system includes a first antenna and a second antenna, where one of the first or second antennas is operating as a primary antenna and the other of the first or second antennas is operating as a diversity antenna. The RF switch is connected with the antenna system, where the RF switch has a first position in which the first antenna is the primary antenna and the second antenna is the diversity antenna, and where the RF switch has a second position in which the second antenna is the primary antenna and the first antenna is the diversity antenna. The controller is coupled with the RF switch, where the controller receives first reflection measurements associated with the antenna system, and where the controller adjusts the RF switch to select between the first and second positions according to the first reflection measurements and during a time period in which the modem enables an antenna switch.

FIG. 1 depicts an illustrative embodiment of a communication device 100. Communication device 100 enables selection antenna selection in a multi-antenna device to improve radiation efficiency. Device 100 can measure the complex input reflection coefficient that is used as feedback for an impedance tuning algorithm. In one embodiment, the complex input reflection coefficient can be measured for both antennas (main and diversity). With averaging, this measurement can be performed in less than 100 us to provide a fast and direct evaluation of how the antenna(s) is loaded. In one embodiment, device 100 can utilize a sense IC for antenna selection. In other embodiments, a feedback receiver integrated in a transceiver IC can be utilized for obtaining the reflection measurements (or other measured parameters).

In one embodiment, communication device 100 can compare a current Sense IC reading (e.g., the complex input reflection coefficient) to a Sense reading that was recorded in freespace. The antenna selection criteria in this example can then be based on a difference between the current loading conditions and freespace as determined in a Sense IC measurement plane.

In one embodiment, closed loop tuning can be performed by the communication device 100 and a comparison can be performed of a converged grid location of the current antenna loading condition to a grid location for freespace. The antenna selection criteria in this example can then be based on a difference between the current loading conditions and freespace as determined in the antenna plane.

In another embodiment, communication device 100 can use a converged grid location as described above. The antenna selection criteria in this example can then be based on a lookup table estimating antenna efficiency as a function of grid location. Depending on the antenna characteristics, a scalar reflection measurement may be utilized.

The communication device 100 can include various components that are arranged in various configurations. The communication device 100 can comprise one or more transceivers 102 coupled to an antenna system 101, which can be any number of antennas. As an example, each transceiver can have transmitter and receiver sections herein described as transceiver 102 or transceivers 102. The communication device 100 can have one or more tunable circuits 122 including reactive element(s) 190, one or more tuning sensors 124, a user interface (UI) 104, a power supply 114, a location receiver 116, a motion sensor 118, an orientation sensor 120, and/or a controller 106 for managing operations thereof. The transceiver 102 can support short-range and/or long-range wireless access technologies, including Bluetooth, ZigBee, Wireless Fidelity (WiFi), Digital Enhance Cordless Telecommunications (DECT), or cellular communication technologies, just to mention a few. The communication device 100 can be a multi-mode device capable of providing communication services via various wireless access technologies, including two or more such services simultaneously.

Cellular technologies used by the communication device 100 can include, for example, Global System for Mobile (GSM), Code Division Multiple Access (CDMA), Time Division Multiple Access (TDMA), Universal Mobile Telecommunications (UMTS), World interoperability for Microwave (WiMAX), Software Defined Radio (SDR), Long Term Evolution (LTE), as well as other next generation wireless communication technologies as they arise. The transceiver 102 can also be adapted to support circuit-switched wireline access technologies such as Public Switched Telephone Network (PSTN), packet-switched wireline access technologies such as TCP/IP, Voice over IP-VoIP, etc., or combinations thereof.

In one or more embodiments, dimensions, shapes and/or positions for the group of antennas of antenna system 101 can achieve a desired performance characteristic while fitting different mechanical arrangements. These dimensions, shapes and/or positions can be adjusted to achieve other desired performance characteristic and/or for fitting other mechanical arrangements.

In one embodiment, the communication device 100 can include an RF switch 150 (or other component) for switching the functionality of antennas of the antenna system 101 including switching primary antennas to diversity antennas and vice versa. For example, parameters of the communication device 100 (e.g., reflection measurements for one, some or all of the antennas) can be monitored, detected or otherwise determined in order to identify a change in impedance. The impedance change can result from a change in use case (e.g., switching from left hand to right hand to hold phone). The identification of the impedance change can trigger a change in the antenna system configuration via the RF switch 150 (e.g., controlled by controller 106). The number of times this switch occurs can be based on the detected parameters, such as according to a user that keeps switching hands during a communication session. The switching of antennas can also be limited by a modem of the communication device 100.

The tunable circuit 122 can comprise one or more variable reactive elements such as variable capacitors, variable inductors, or combinations thereof that are tunable with digital and/or analog bias signals. The tunable circuit 122 can represent a tunable matching network coupled to the antenna system 101 to compensate for a change in impedance of the antenna 101, a compensation circuit to compensate for mutual coupling in a multi-antenna system, an amplifier tuning circuit to control operations of an amplifier of the transceiver 102, a filter tuning circuit to alter a pass band of a filter used by the transceiver 102, and so on. In one or more embodiments, the tunable circuit 122 can be connected with one, some or all of the antennas of antenna system 101 to enable impedance tuning.

In one or more embodiments, tuning sensors 124 can be placed at any stage of the transceiver 102 such as, for example, before or after a matching network, and/or at a power amplifier. The tuning sensors 124 can utilize any suitable sensing technology such as directional couplers, voltage dividers, or other sensing technologies to measure signals at any stage of the transceiver 102. The digital samples of the measured signals can be provided to the controller 106 by way of analog-to-digital converters included in the tuning sensors 124. Data provided to the controller 106 by the tuning sensors 124 can be used to measure, for example, transmit power, transmitter efficiency, receiver sensitivity, power consumption of the communication device 100, frequency band selectivity by adjusting filter passbands, linearity and efficiency of power amplifiers, specific absorption rate (SAR) requirements, and so on. The controller 106 can be configured to execute one or more tuning algorithms to determine desired tuning states of the tunable circuit 122 based on the foregoing measurements. The controller 106 can also switch the primary and diversity antennas via RF switch 150 based on data obtained from the tuning sensors 124, including based on reflection measurements.

The UI 104 can include a depressible or touch-sensitive keypad 108 with a navigation mechanism such as a roller ball, a joystick, a mouse, or a navigation disk for manipulating operations of the communication device 100. The keypad 108 can be an integral part of a housing assembly of the communication device 100 or an independent device operably coupled thereto by a tethered wireline interface (such as a USB cable) or a wireless interface supporting, for example, Bluetooth. The keypad 108 can represent a numeric keypad commonly used by phones, and/or a QWERTY keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is touch-sensitive, a portion or all of the keypad 108 can be presented by way of the display 110 with navigation features.

The display 110 can use touch screen technology to also serve as a user interface for detecting user input. As a touch screen display, the communication device 100 can be adapted to present a user interface with graphical user interface (GUI) elements that can be selected by a user with a touch of a finger. The touch screen display 110 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 110 can be an integral part of the housing assembly of the communication device 100 or an independent device communicatively coupled thereto by a tethered wireline interface (such as a cable) or a wireless interface.

The UI 104 can also include an audio system 112 that utilizes audio technology for conveying low volume audio (such as audio heard in proximity of a human ear) and high volume audio (such as speakerphone for hands free operation). The audio system 112 can further include a microphone for receiving audible signals of an end user. The audio system 112 can also be used for voice recognition applications. The UI 104 can further include an image sensor 113 such as a charged coupled device (CCD) camera for capturing still or moving images.

The power supply 114 can utilize common power management technologies such as replaceable and rechargeable batteries, supply regulation technologies, and/or charging system technologies for supplying energy to the components of the communication device 100 to facilitate long-range or short-range portable applications. Alternatively, or in combination, the charging system can utilize external power sources such as DC power supplied over a physical interface such as a USB port or other suitable tethering technologies.

The location receiver 116 can utilize location technology such as a global positioning system (GPS) receiver capable of assisted GPS for identifying a location of the communication device 100 based on signals generated by a constellation of GPS satellites, which can be used for facilitating location services such as navigation. The motion sensor 118 can utilize motion sensing technology such as an accelerometer, a gyroscope, or other suitable motion sensing technology to detect motion of the communication device 100 in three-dimensional space. The orientation sensor 120 can utilize orientation sensing technology such as a magnetometer to detect the orientation of the communication device 100 (north, south, west, and east, as well as combined orientations in degrees, minutes, or other suitable orientation metrics).

The communication device 100 can use the transceiver 102 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements.

The controller 106 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 100.

Other components not shown in FIG. 1 can be used by the subject disclosure. The communication device 100 can include a slot for inserting or removing an identity module such as a Subscriber Identity Module (SIM) card. SIM cards can be used for identifying and registering for subscriber services, executing computer programs, storing subscriber data, and so forth.

Figure 2:
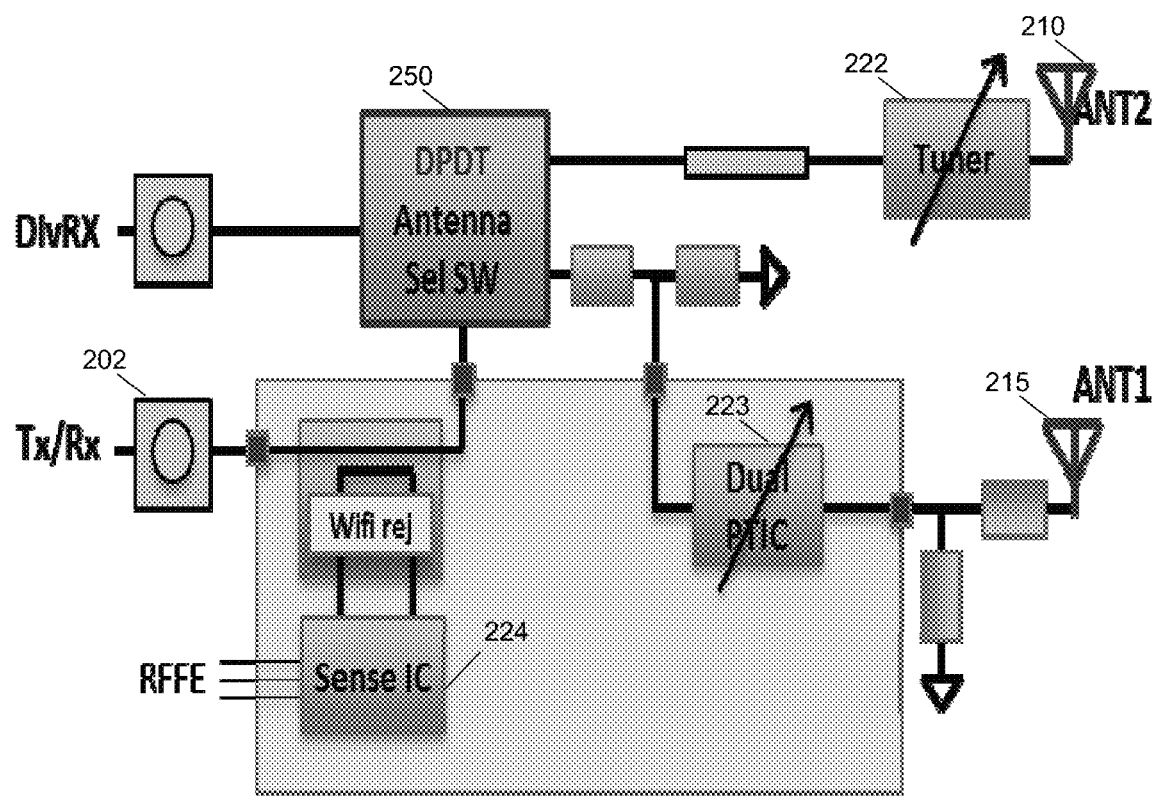

Referring to FIG. 2, a portion of a communication device 200 is illustrated. The device 200 can have any number of antennas, only two of which are shown (210, 215). A Sense IC 220 can perform reflection measurements that are used as feedback for closed loop antenna tuning via one or both of tuners 222 and 223. An RF switch 250, which is depicted as a DPDT switch, can be utilized for antenna selection so that the transmitter 202 can be routed to the antenna that has the most favorable loading conditions for radiation.

The reflection measurements from the Sense IC 224 can be used to determine the loading conditions of each antenna 210, 215 and can be used as the selection criteria for the antenna selection. In one or more embodiments, a feedback receiver (not shown) can be integrated in the transceiver integrated circuit (e.g., in place of the Sense IC 224) for obtaining operational parameters such as the reflection measurements of the transmitting antenna.

The tuners 222 and/or 223 can utilize various tunable reactive elements including capacitors and/or indictors. For example, tuners 222 and/or 223 can include voltage or current tunable dielectric materials. The tunable dielectric materials can utilize, among other things, a composition of barium strontium titanate (BST). In another embodiment, the tunable reactive elements can utilize semiconductor varactors, or micro-electromechanical systems (MEMS) technology capable of mechanically varying the dielectric constant of a capacitor. Other present or next generation methods or material compositions that result in a voltage or current tunable reactive element are applicable to the subject disclosure for use by the tuners 222 and/or 223.

Figure 3A:
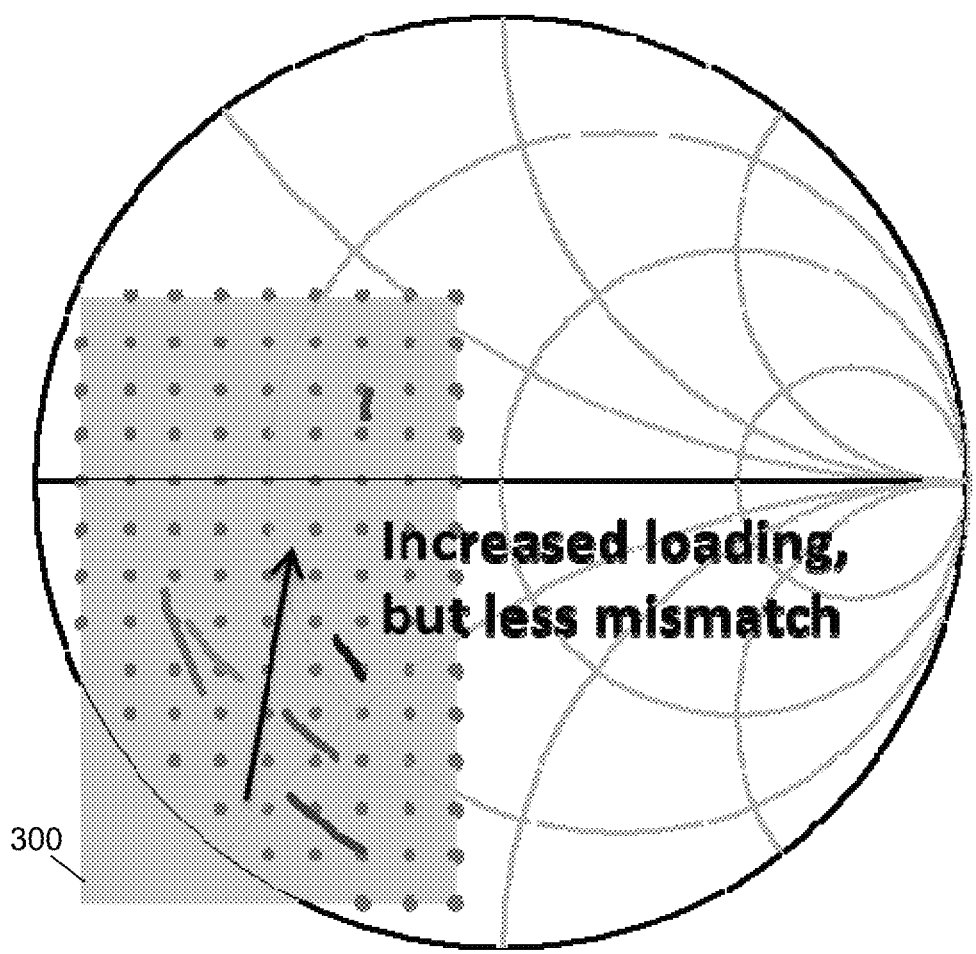
FIGS. 3A-3F depict communication devices that provide antenna selection to improve radiation efficiency and depict graphical representations of tuning grids utilized for antenna selection.
Figure 3C:
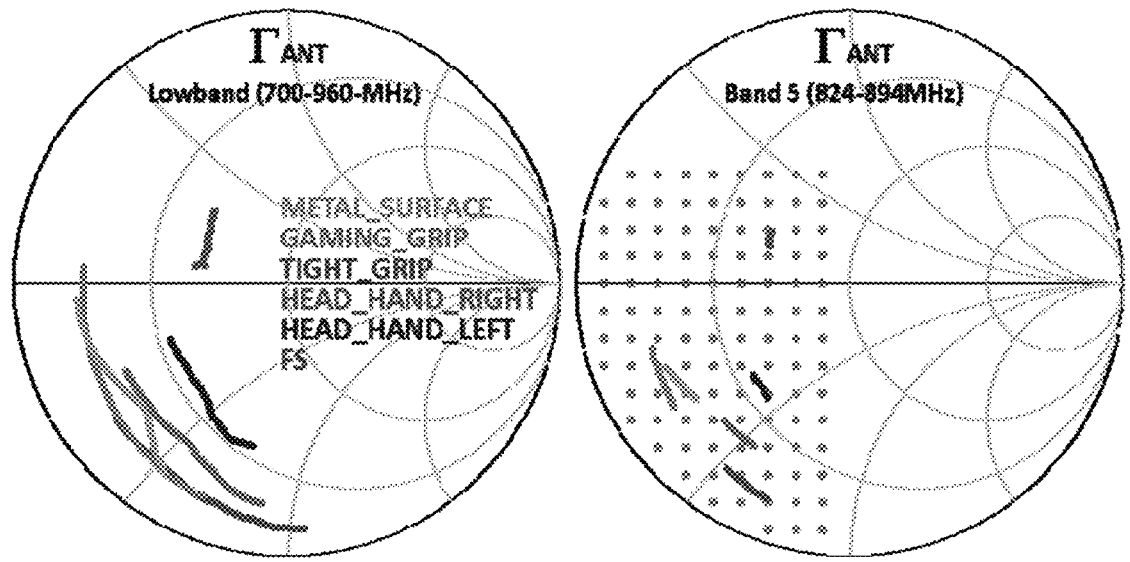

Referring to FIG. 3A, a tuning grid 300 is illustrated that can be used for antenna selection by way of transmission Gamma measurements. For example, a grid location can be determined by a closed-loop tuning algorithm and can be used as an input for the antenna selection. For instance, each grid location in a lookup table stored in the communication device 200 can have an entry for efficiency. In this example, the grid location can be determined by coarse tuning. In another example, the grid location can be further refined using fine tuning. In one embodiment, a distance from the grid location to the freespace antenna S11 location (referred to as FS_delta) can be utilized for the antenna selection. In another embodiment, instead of utilizing an algorithm-derived grid location, the communication device 200 can perform the antenna selection based directly on measurements from the Sense IC 224.

Figure 3B:
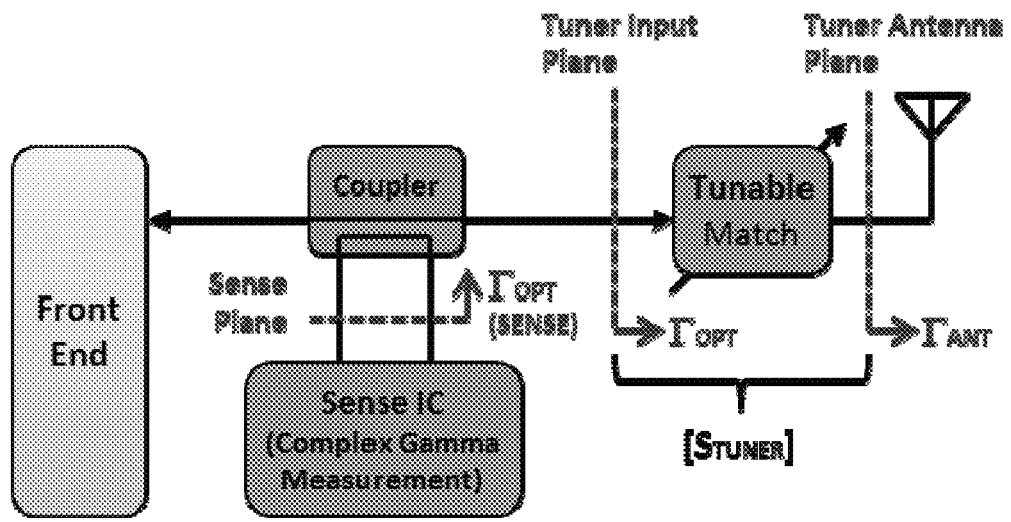

Referring to FIGS. 3B and C, a schematic of a portion of a communication device is illustrated along with corresponding Smith charts for the device's operation. The antenna S11 parameter for all use cases can be examined in each band (or subband). For each band, a tuning grid in the antenna plane can be set or determined to sufficiently cover the entire range of use cases. $\Gamma_{ANT}$ is antenna S11 at the antenna plane. $\Gamma_{OPT}$ is tuner S11 at the tuner input plane for each $\Gamma_{ANT}$ with the optimal tuning state applied to the tuner for each $\Gamma_{ANT}$. $\Gamma_{OPT(SENSE)}$ is $\Gamma_{OPT}$ as measured by the Sense IC at the Sense plane.

FIGS. 3B and C illustrate implementation of 2D tuning. The tuning domain can be on a 2-dimensional grid in the Antenna Gamma space which sufficiently covers all antenna uses cases. The grid can be rectangular, polar, or annular, and is not required to be uniform. Each grid location can correspond to the antenna gamma at the TX frequency. For each grid location, the antenna gamma at the RX frequency can be estimated based on S-parameter characterization of the antenna. For each grid location, the tuner S-parameters can be evaluated at all tuning states and the optimal tuning state (e.g., set of DAC values) can be recorded in a table or other data structure. There can be any number of DACs for each tuning state, but the search can still be 2-dimensional in the gamma space. The optimal or improved tuning state can be optimized or improved for TX, RX, both TX and RX, or other combinations such as carrier aggregation. A compromise between operational parameters and/or TX and RX mode can also be utilized during the tuning and/or antenna selection.

Figure 3D:
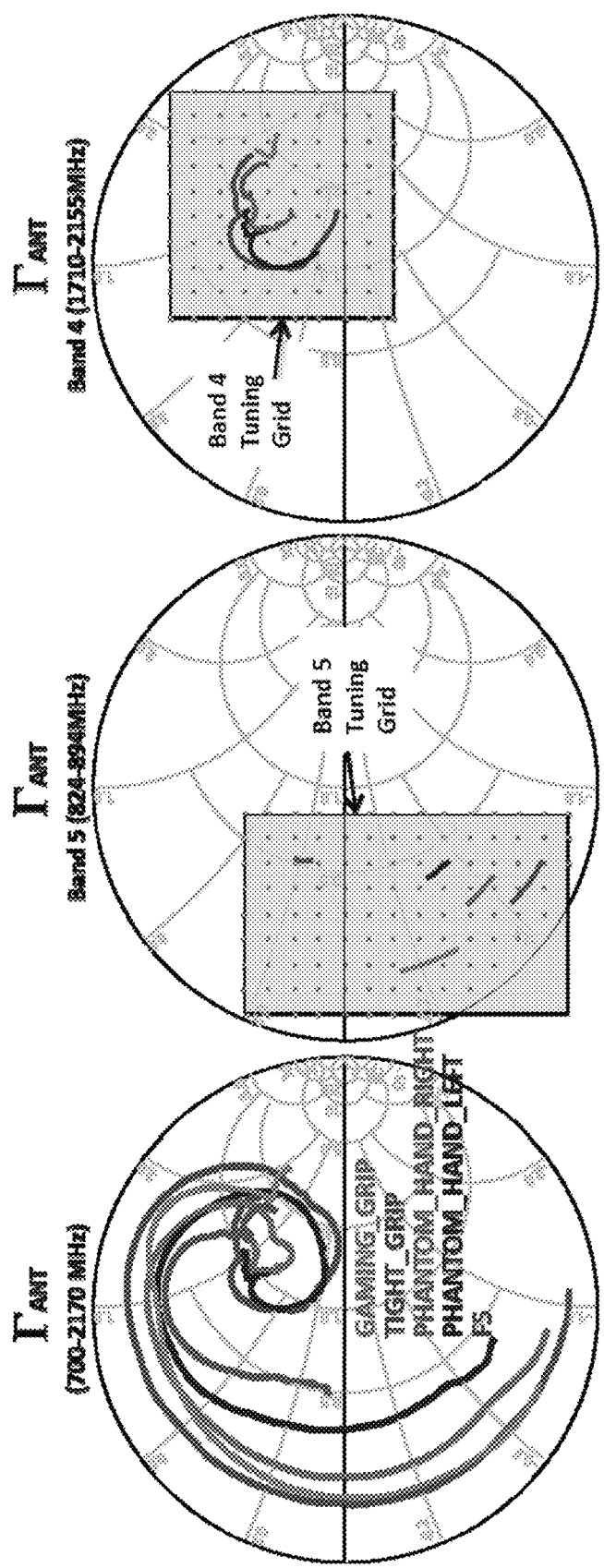

FIG. 3D illustrates a tuning grid established and utilized for bands 4 and 5. The antenna S11 for all use cases can be examined in each band (or subband). For each band, a tuning grid in the antenna plane is set to sufficiently cover the entire range of use cases.

Figure 3E:
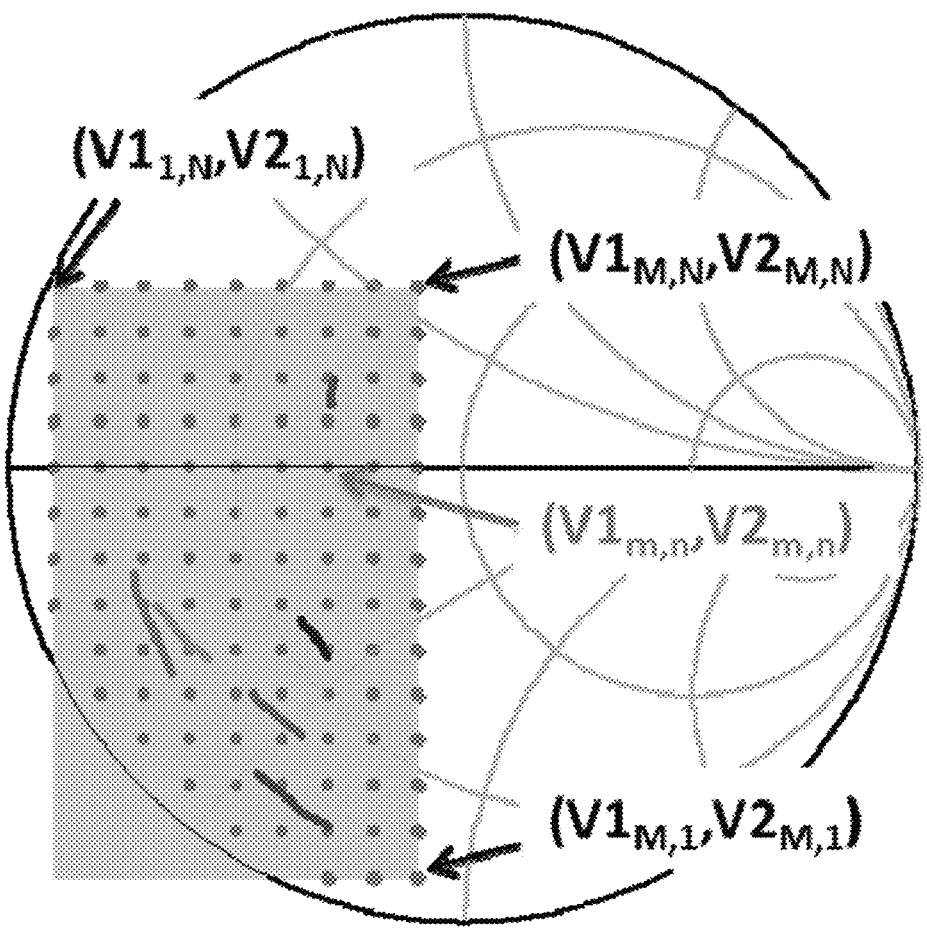

Referring to FIG. 3E, 2D tuning for a tuner with two voltage controlled capacitors is illustrated. V1 and V2 can be determined in advance and stored in a lookup table in the communication device for each point in the 2D, M×N grid. V1 and V2 can be restricted to the pairs listed in the table. The tuning can be performed in the 2D grid space varying m and n. V1 and V2 can be retrieved from the lookup table based on the grid position. In one embodiment, V1 and V2 cannot vary independently. M and n can be the two independent variables and V1 and V2 can be strictly dependent on m and n.

Figure 3F:
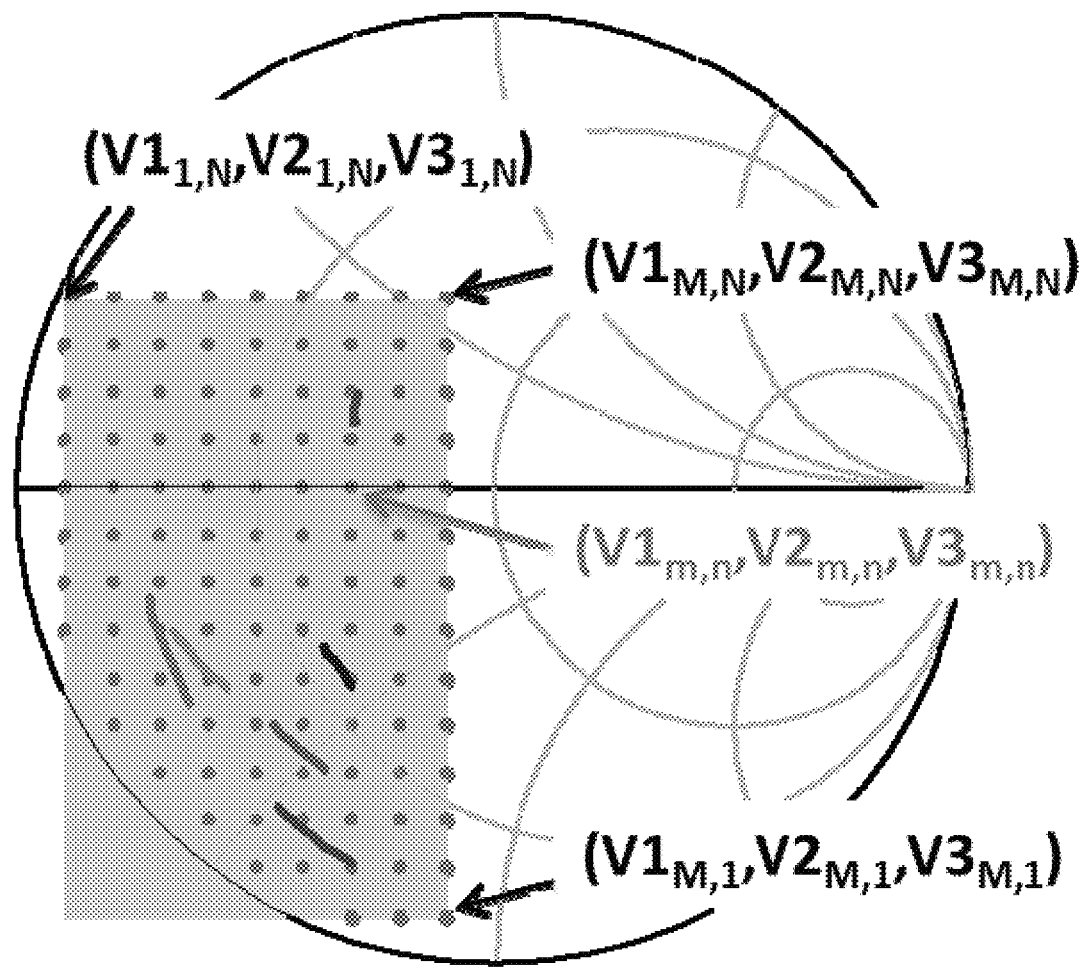

Referring to FIG. 3F, 2D tuning for a tuner with three voltage controlled capacitors is illustrated. V1, V2 and V3 can be determined in advance and stored in a lookup table for each point in the 2D, M×N grid. V1, V2 and V3 can be restricted to the pairs listed in the table. The tuning can be performed in the 2D grid space varying m and n. V1, V2 and V3 can be retrieved from the lookup table based on the grid position. In one embodiment, V1, V2 and V3 cannot vary independently. M and n are the two independent variables and V1, V2 and V3 can be strictly dependent on m and n.

By utilizing 2D tuning rather than 3D tuning, even for three tunable reactance devices, the exemplary embodiment can avoid a failure of convergence and/or solutions trapped at local minima With 3D tuning, determined tuning values can have low reflection loss but high dissipative loss which is still undesired. The 2D tuning algorithm of the exemplary embodiments, filters out such lossy solutions for tuning values.

Figure 4:
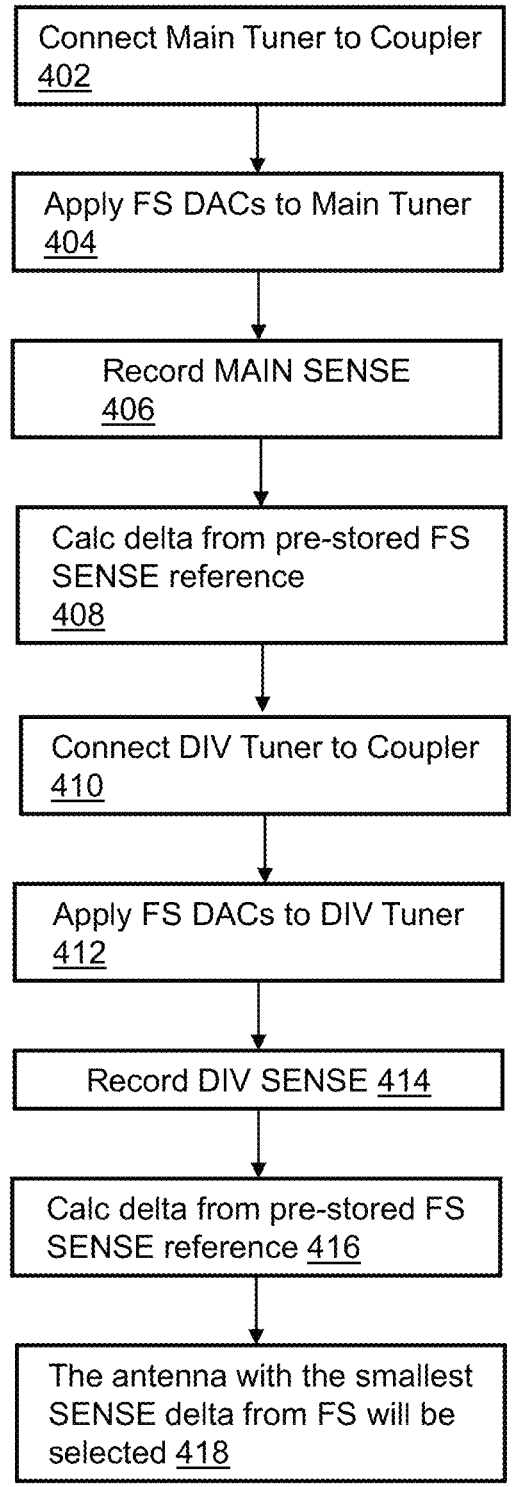
FIGS. 4 and 5 depict illustrative embodiments of methods of antenna selection to improve radiation efficiency.

Referring to FIG. 4, a method 400 is illustrated for performing antenna selection in a communication device, such as the communication device 200 of FIG. 2. Method 400 utilizes the Sense plane and FS_Delta for antenna selection.

At 402, the main tuner (e.g., tuner 222) can be connected with the coupler. At 404, freespace DAC values can be applied to the main tuner and at 406 the reflection measurements can be obtained and recorded for the primary antenna. At 408, the difference or delta can be determined between the measured values and a pre-stored FS SENSE reference. For example, an FS reference can be stored for each individual unit by using a factory calibration. The FS reference may include offsets for efficiency differences.

At 410, the diversity tuner (e.g., tuner 223) can be connected with the coupler. At 412, freespace DAC values can be applied to the diversity tuner and at 414 the reflection measurements can be obtained and recorded for the diversity antenna. At 416, the difference or delta can be determined between the measured values and a pre-stored FS SENSE reference. At 418, the antenna with the smallest delta from the FS reference can be selected for transmitting. Method 400 can be repeated during a communication session since operating conditions can change, such as a user changing hands or interference patterns changing. In one embodiment, the switching to a selected antenna is subject to permission from the modem.

Figure 5:
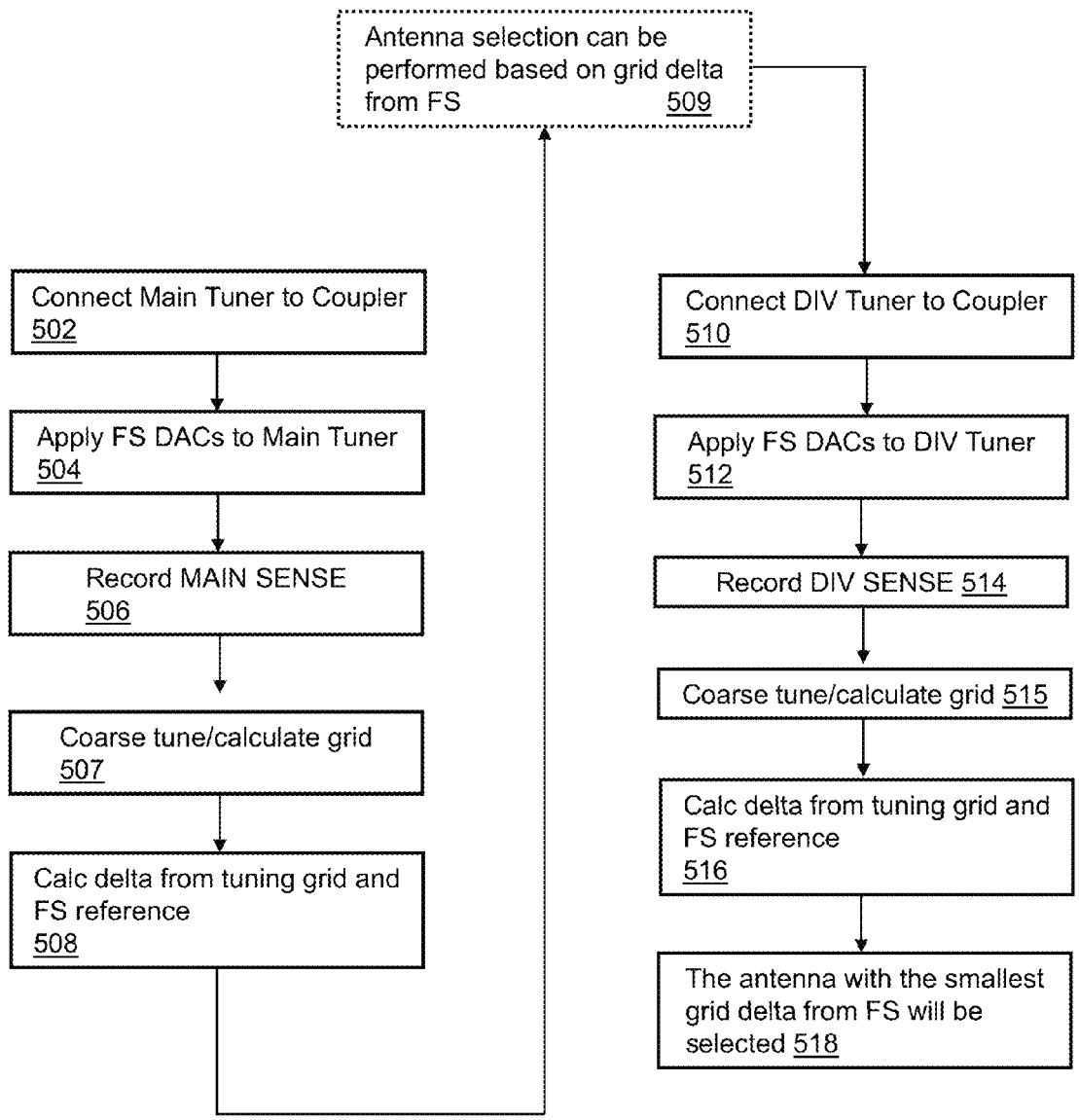

Referring to FIG. 5, a method 500 is illustrated for performing antenna selection in a communication device, such as the communication device 200 of FIG. 2. Method 500 utilizes the antenna plane and FS Grid Delta for antenna selection.

At 502, the main tuner (e.g., tuner 222) can be connected with the coupler. At 504, freespace DAC values can be applied to the main tuner and at 506 the reflection measurements can be obtained and recorded for the primary antenna.

At 507, tuning, such as coarse tuning, can be performed and/or the tuning grid (e.g., grid 300) can be calculated for the coarse tune. At 508, the difference or delta can be determined between the location of the tuning grid and a FS location on the tuning grid. In one embodiment, antenna selection can be performed based on the determined delta, such as satisfying a threshold. In another embodiment, method 500 can proceed from 508 to 510 without switching antennas.

At 510, the diversity tuner (e.g., tuner 223) can be connected with the coupler. At 512, freespace DAC values can be applied to the diversity tuner and at 514 the reflection measurements can be obtained and recorded for the diversity antenna. At 515, tuning, such as coarse tuning, can be performed and/or the tuning grid (e.g., grid 300) can be calculated for the coarse tune. At 516, the difference or delta can be determined between the location of the tuning grid and a FS location on the tuning grid. At 518, the antenna with the smallest grid delta from the FS reference location can be selected for transmitting. Method 500 can be repeated during a communication session since operating conditions can change, such as a user changing hands or interference patterns changing. In one embodiment, the switching to a selected antenna is subject to permission from the modem.

Figure 6:
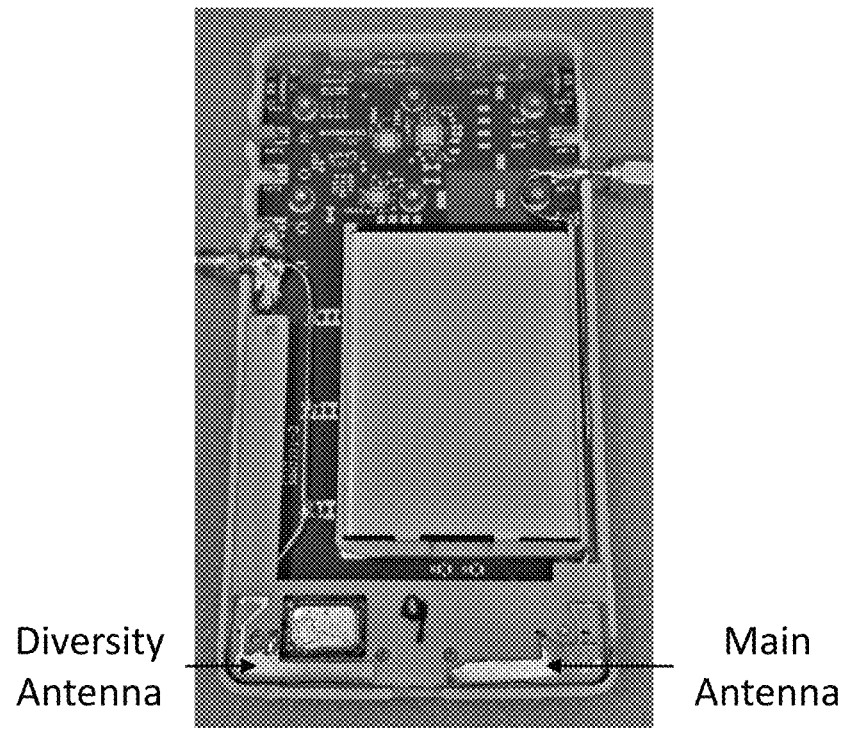
FIGS. 6-12 depict a communication device that provides antenna selection to improve radiation efficiency, graphical representations of tuning grids and efficiency data utilized for antenna selection.
Figure 7:
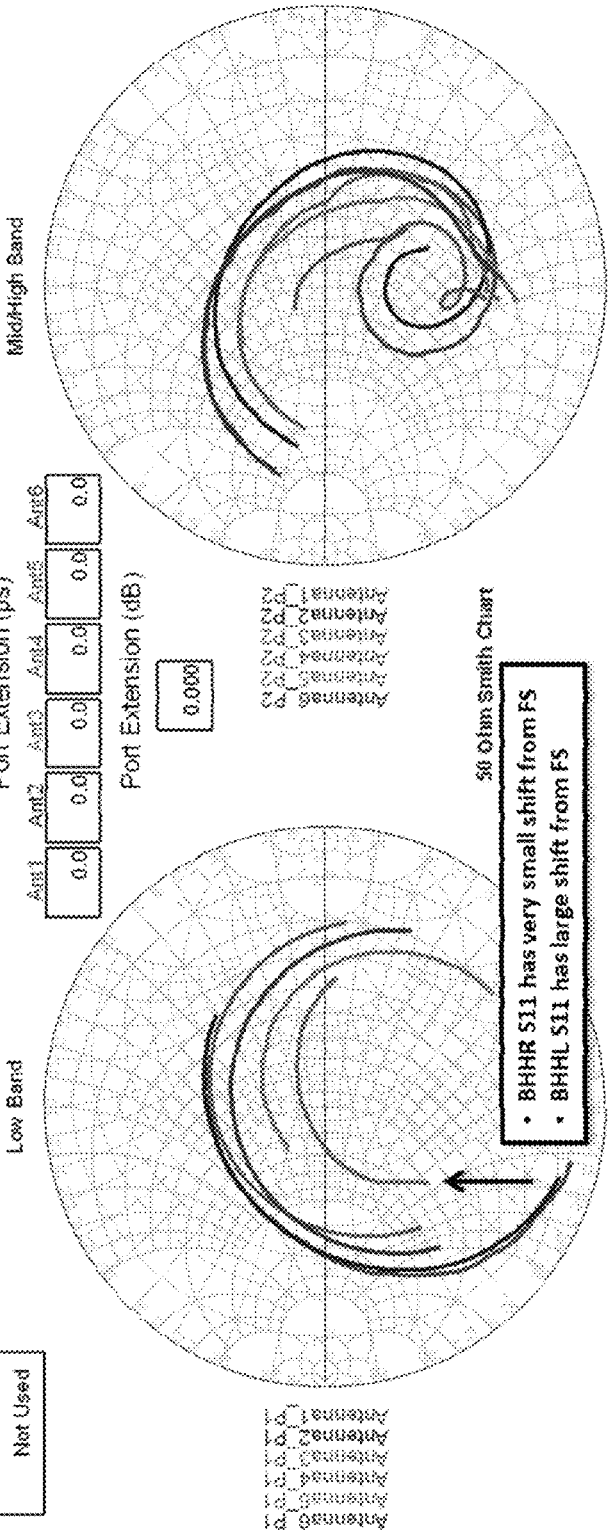
Figure 8:
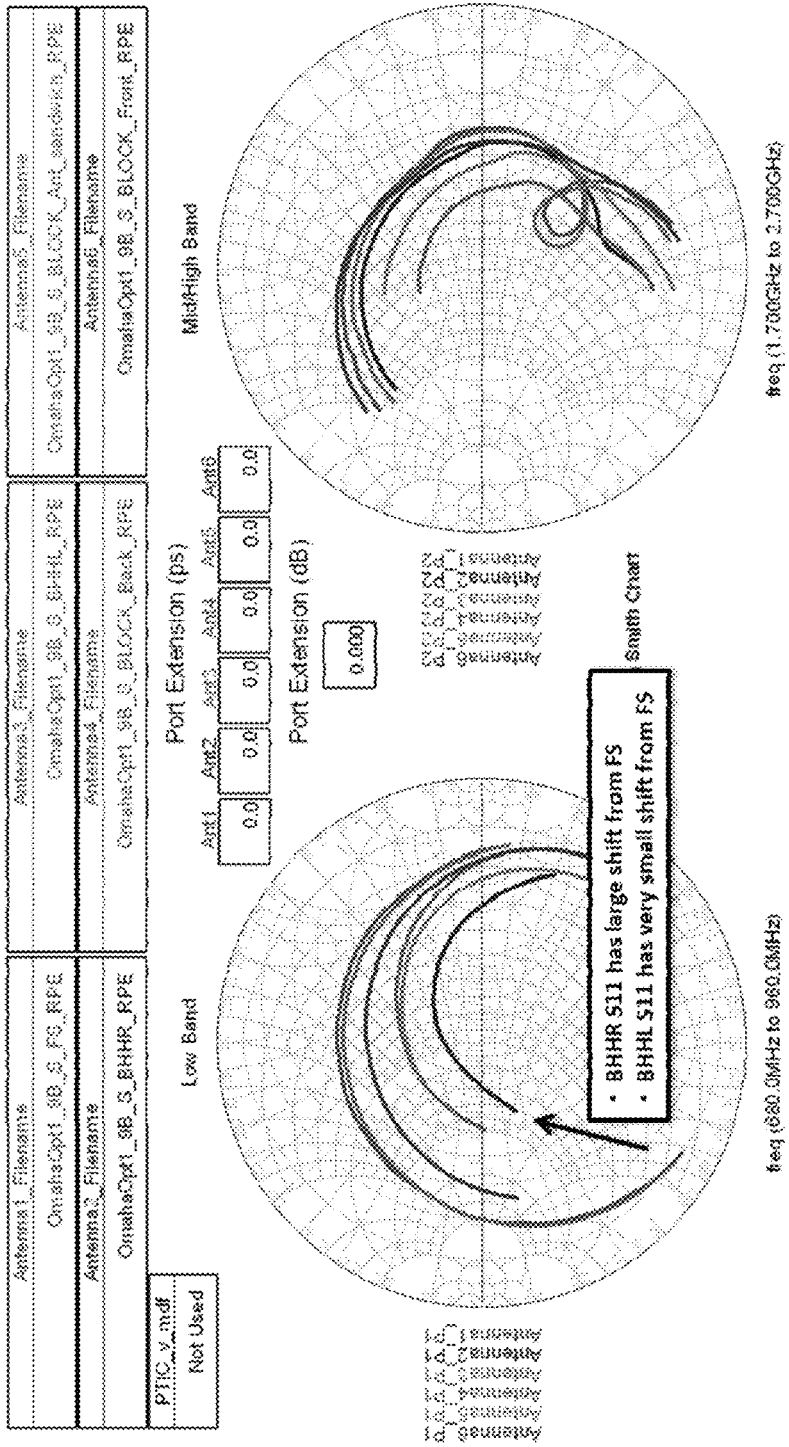

As a further example of method 500 and referring additionally to FIG. 6, a portion of a communication device 600 is illustrated. Device 600 can include switchable primary and diversity antennas 610, 615. Radiation efficiency between the antennas 610, 615 can be different based on a number of factors, such as which user hand is holding the phone and so forth. Reflection measurement data is illustrated In FIGS. 7 and 8 for the main and diversity antennas 610, 615 for different use cases (e.g., BHHR and BHHL) in different frequency bands. The Smith charts depict the distance or delta between the location on the Smith chart and a location corresponding to free space. In some instance, differentiating between different use cases based solely on reflection measurements can be difficult. In one or more embodiments, other information or inputs can be utilized to facilitate distinguishing the use cases. For example, a proximity sensor can be utilized to gather proximity data that can be utilized in distinguishing between use cases (e.g., BHHR vs Freespace). In another example, capacitive information, such as from a capacitive sensor attached to one, some or all of the antennas or from a capacitive sensor attached to the touch screen, can be utilized in distinguishing between the use cases. Other inputs can also be used in facilitating distinguishing between use cases, such as the operational frequency range. In these examples, reflection measurements and other obtained information can be utilized for the antenna selection and/or for impedance tuning.

Figure 9:
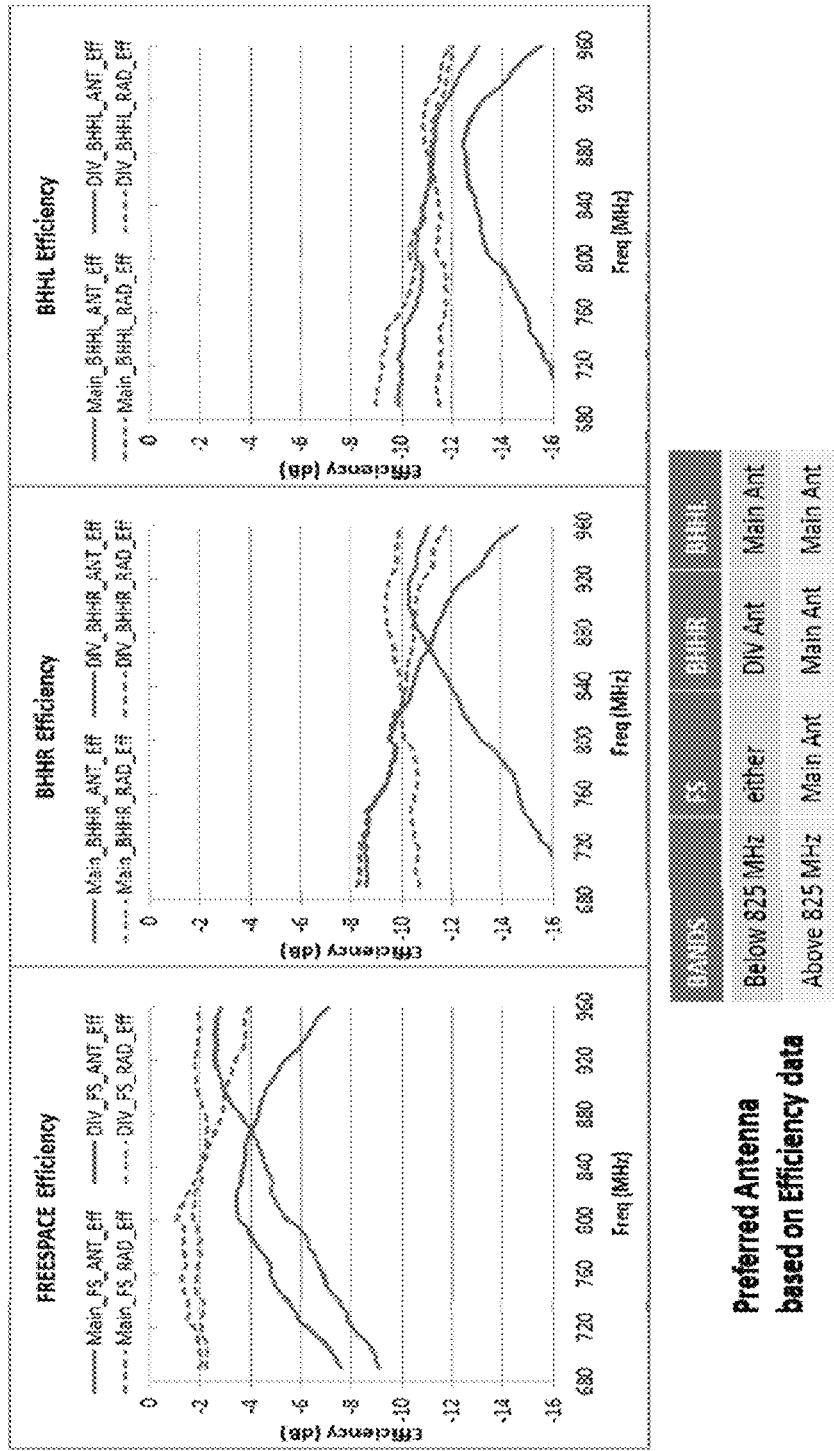

Referring to FIG. 9, radiation efficiency for the main and diversity antennas at different frequencies in a lowband according to different use cases is illustrated based on a calculation of subtracting mismatch loss from antenna efficiency.

Figure 10:
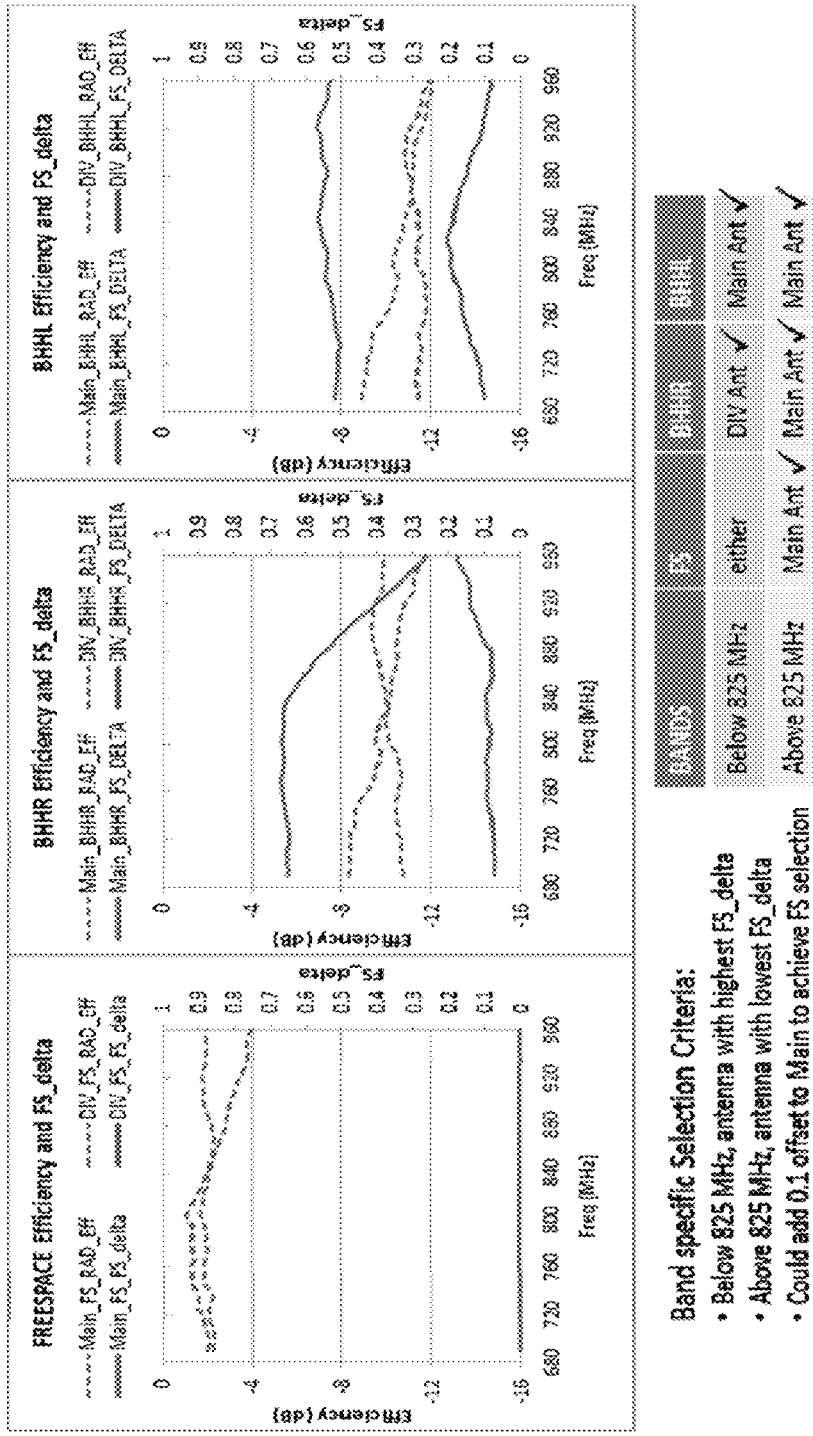

FIG. 10 illustrates antenna selection by applying the process of method 500 according to FS_delta criteria. As shown in FIG. 10, other inputs, such as the operating frequency range can be utilized in combination with the reflection measurements to facilitate in distinguishing between different use cases. The other inputs are not limited to frequency data, and can include proximity information from a proximity sensor, capacitive data from a capacitive sensor (e.g., attached to the antenna or attached to a touch screen), and so forth.

Figure 11:
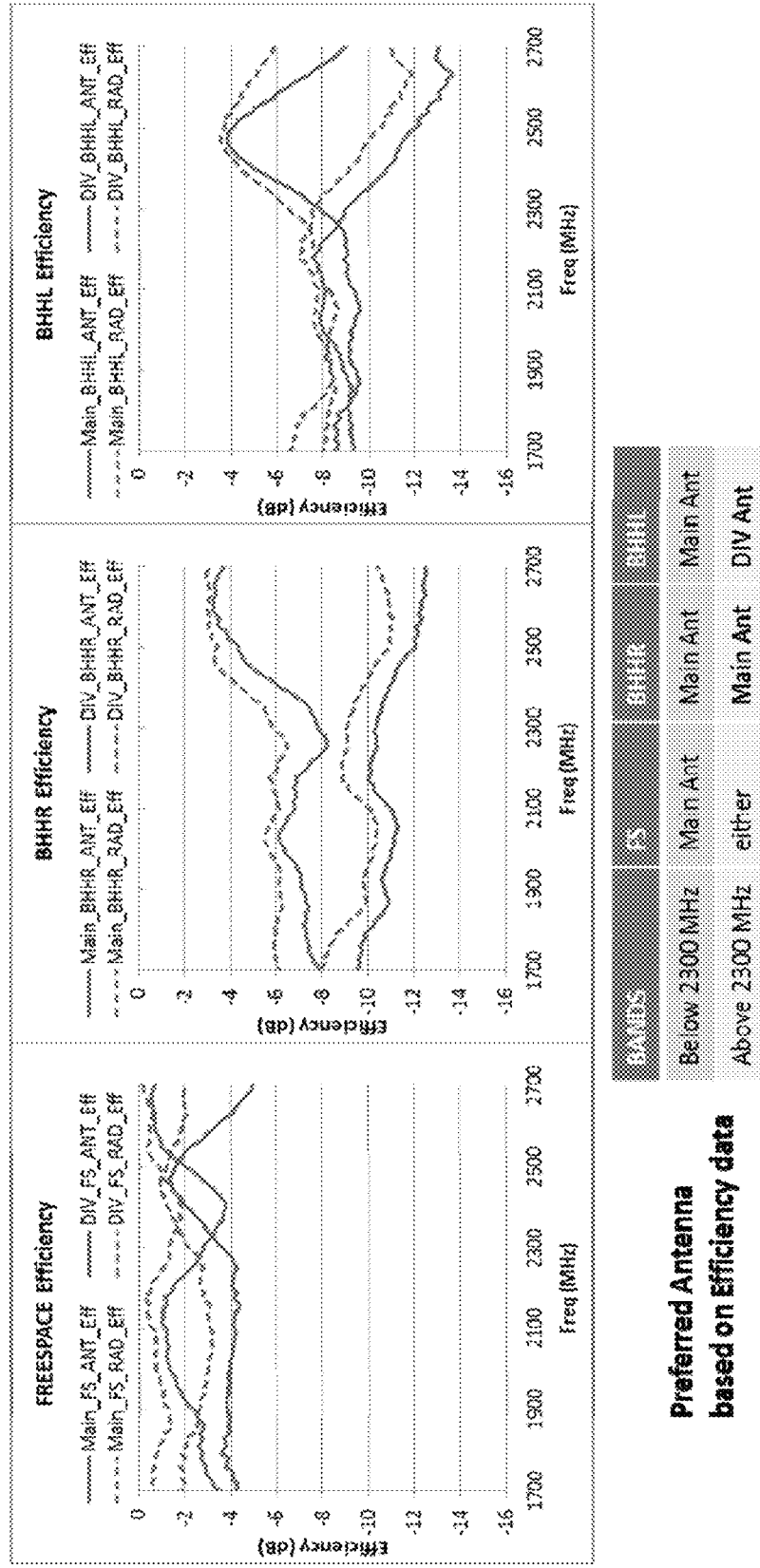
Figure 12:
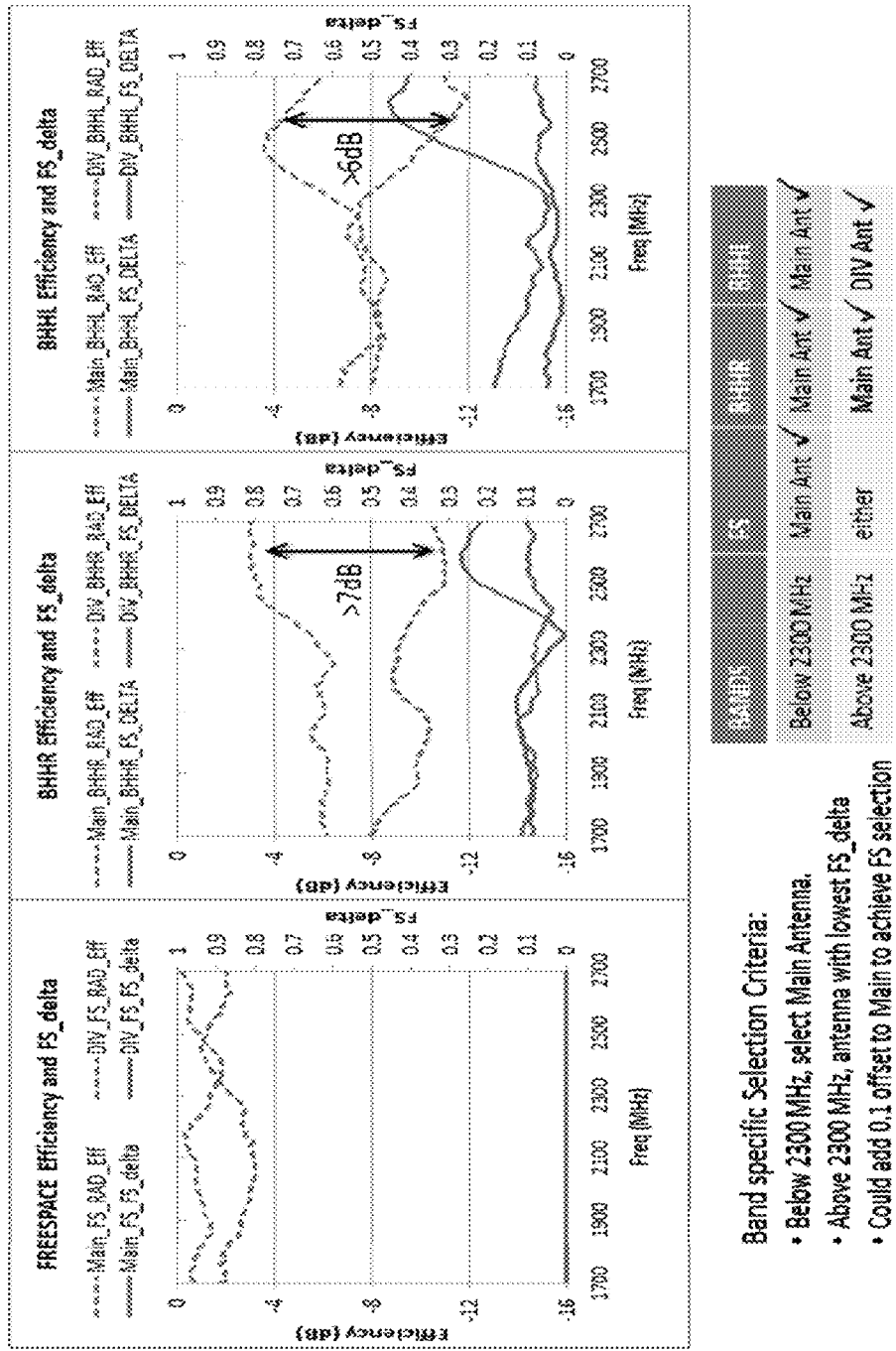

Referring to FIG. 11, radiation efficiency for the main and diversity antennas at different frequencies in a mid/highband according to different use cases is illustrated based on a calculation of subtracting mismatch loss from antenna efficiency. FIG. 12 illustrates antenna selection by applying the process of method 500 according to FS_delta criteria.

Figure 13:
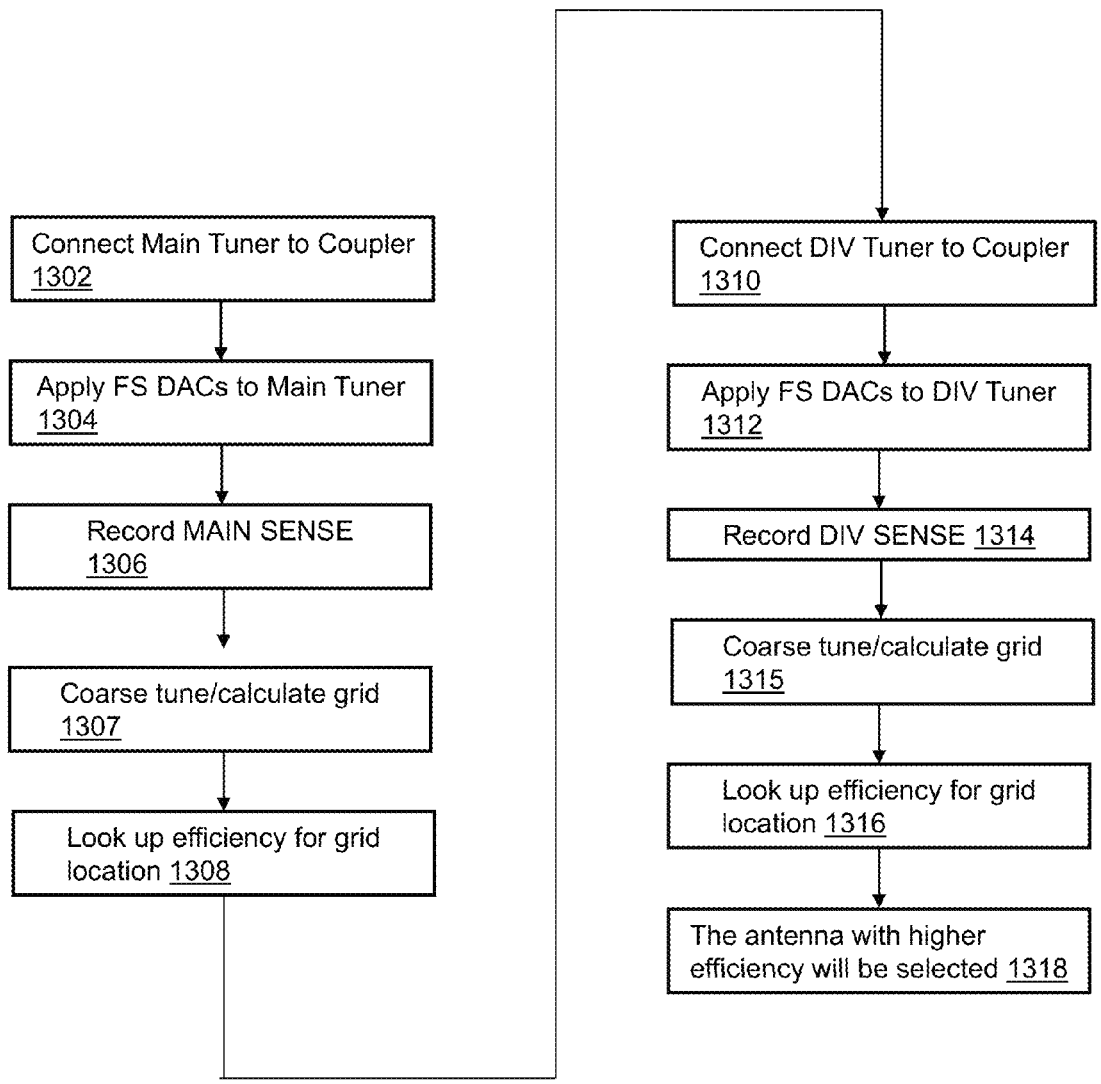
FIG. 13 depicts an illustrative embodiment of a method of antenna selection to improve radiation efficiency.

Referring to FIG. 13, a method 1300 is illustrated for performing antenna selection in a communication device, such as the communication device 200 of FIG. 2. Method 1300 utilizes the antenna plane and an efficiency lookup table for antenna selection.

At 1302, the main tuner (e.g., tuner 222) can be connected with the coupler. At 1304, freespace DAC values can be applied to the main tuner and at 1306 the reflection measurements can be obtained and recorded for the primary antenna.

At 1307, tuning, such as coarse tuning, can be performed and/or the tuning grid (e.g., grid 300) can be calculated for the coarse tune. At 1308, the antenna efficiency can be determined by looking it up in a lookup table according to the grid location. As described earlier with respect to tuning grid 300, each grid location can have an entry in a lookup table for efficiency. The grid location can be determined by coarse tuning and/or the grid location can be further refined using fine tuning.

At 1310, the diversity tuner (e.g., tuner 223) can be connected with the coupler. At 1312, freespace DAC values can be applied to the diversity tuner and at 514 the reflection measurements can be obtained and recorded for the diversity antenna. At 1315, tuning, such as coarse tuning, can be performed and/or the tuning grid (e.g., grid 300) can be calculated for the coarse tune. At 1316, the antenna efficiency can be determined by looking it up in a lookup table according to the grid location. At 1318, the antenna with the higher efficiency can be selected for transmitting. Method 1300 can be repeated during a communication session since operating conditions can change, such as a user changing hands or interference patterns changing. In one embodiment, the switching to a selected antenna is subject to permission from the modem.

Referring to FIG. 14, a table 1400 is illustrated which can be used for antenna selection. For this example and further referring to communication device 200 of FIG. 2, the device can be transmitting on antenna 215 as the primary antenna. A closed loop tuning algorithm for antenna 215 can be executed by a processor of device 200 utilizing the Sense IC 224. In one embodiment, antenna 210 can be operating as the diversity antenna, which can be executing an open loop tuning algorithm.

In this example, during the closed loop algorithm State 0-1 (OL), the antenna selection bit can be set as AntSel=0 (don't switch). During the closed loop algorithm states 2-n (e.g., n=13), the current grid winner can be compared to RealIndSW and ImagIndSw and the nearest use case can be determined. The antenna selection bit can be updated based on the SwAnt value in the table for the nearest use case. In this example, when the modem permits switching antennas (RX_ON) the following is applied:

If AntSel=0, then do not switch. Continue closed loop algorithm.

If AntSel=1: switch antennas; apply RX DACs to main antenna; and apply DX DACs to diversity antenna.

Figure 15:
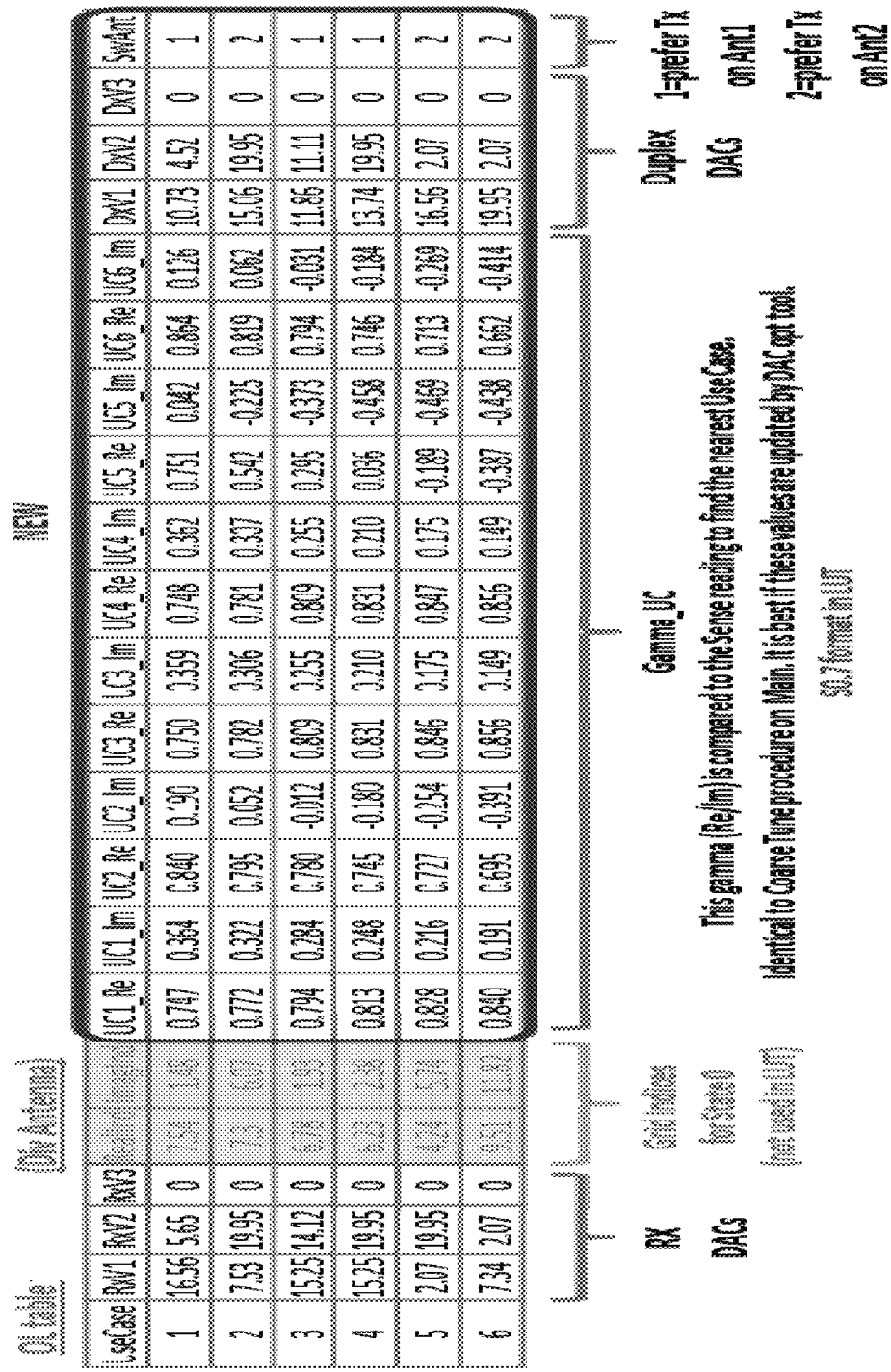

Referring to FIG. 15, a table 1500 is illustrated which can be used for antenna selection. For this example and further referring to communication device 200 of FIG. 2, the device can be transmitting on antenna 210. When transmitting on antenna 210, the processor of the device 200 can switch from an open loop tuning algorithm to a closed loop tuning algorithm utilizing the Sense IC 224. The closed loop tuning algorithm can utilize coarse tuning. In this example, when transmitting on antenna 210, the processor can continue to perform reflection measurements readings (via the Sense IC 224) at a same rate as used in the closed loop algorithm on antenna 215.

The Sense IC reading can be compared by the processor to each gamma_UC to find a nearest use case. In one embodiment, a Sense IC validity check can be performed according to obtaining consecutive readings within 0.1. The processor can update the tuning based on a derived use case. The processor can update the antenna selection bit based on SwAnt value in the table for the nearest use case. In one embodiment, when the modem permits switching antennas (RX_ON), the following can be applied:

If AntSel=0, then do not switch. Continue applying coarse tuning algorithm on diversity.

If AntSel=1, switch antennas; apply RX DACs to diversity antenna; and apply DX DACs to main Antenna.

In one or more embodiments, the switching of antennas can cause different tuning to be applied to the different antennas. For example in a two antenna system where an antenna switch occurs (e.g., via RF switch 250 of FIG. 2), one of the antennas can switch from a main antenna to a diversity antenna while the other antenna can switch from the diversity antenna to the main antenna. By switching roles, the antennas also switch functions from a combination of transmit and receive functions to a receive-only function, and vice versa. The switching of functions can cause switching of tuning states for each of the antennas. For instance, the antenna which is now only a receive antenna can be tuned to optimize or otherwise improve receiving via a first tunable reactance circuit while the antenna which is now both a transmit and receive antenna can be tuned for a compromise between improving receiving and improving transmitting via a second tunable reactance circuit.

In one or more embodiments, different tuning values can be utilized without changing antennas according to whether the particular antenna is set to optimize receiving or whether the particular antenna is set to compromise between transmit and receive. For instance, while an antenna is in the receive mode a first set of tuning values can be utilized via the RX DAC's and while the antenna is in a transmit mode a second set of tuning values can be utilized via the duplex DAC's.

Figure 16:
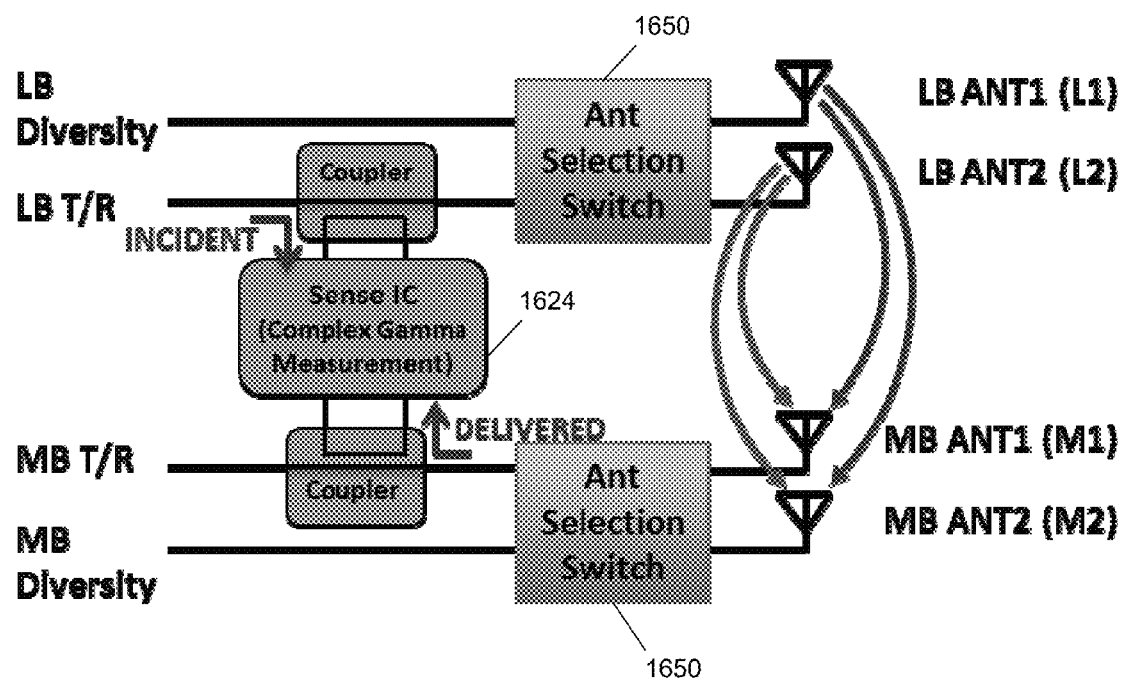
FIG. 16 depicts a communication device that provides antenna selection to improve radiation efficiency.

Referring to FIG. 16, a portion of a communication device 1600 is illustrated which can utilize antenna selection based on operational parameters obtained from a Sense IC 1624. Various other components can be utilized to facilitate the capturing and analysis of operational parameters (e.g., reflection measurements) including directional couplers, as well as to facilitate the switching antennas, such as switches 1650. In one embodiment, device 1600 can measure power coupled to the other antennas to estimate absorption. For example, the following measurements can be performed:

Measure $LB1$ to $MB1(P\_L1M1=L1\_INC-M1\_DEL)$

Measure $LB2$ to $MB1(P\_L2M1=L2\_INC-M1\_DEL)$

Measure $LB1$ to $MB2(P\_L1M2=L1\_INC-M2\_DEL)$

Measure $LB2$ to $MB2(P\_L2M2=L2\_INC-M2\_DEL)$

A freespace 2×2 characterization can be employed to determine a calibration matrix. Absorption can then be calculated according to the following:

$ABS11=P\_L1M1-P\_L1M1\_FS$ $ABS21=P\_L2M1-P\_L2M1\_FS$ $ABS12=P\_L1M2-P\_L1M2\_FS$ $ABS22=P\_L2M2-P\_L2M2\_FS$

In one or more embodiments, less than all of the measurements may be performed, such as measurements of only two of the four paths in this example. In one embodiment, if the MB operation includes tuning, the tuning can be specifically set for LB operation. This example makes use of the HB antenna(s) to perform the transmission measurements. Alternatively, a strategically located, separate antenna may be used.

Figure 17:
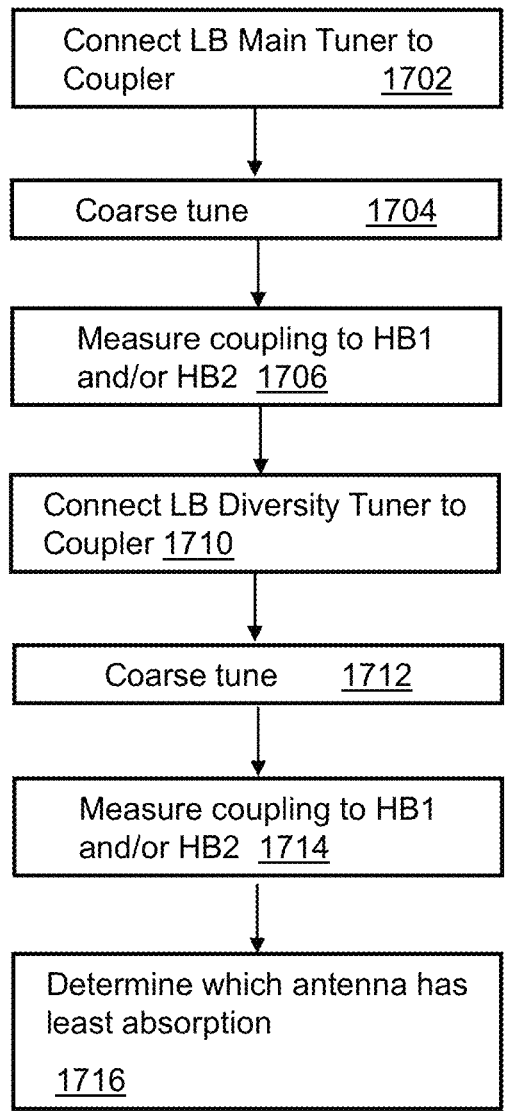
FIG. 17 depicts an illustrative embodiment of a method of antenna selection to improve radiation efficiency.

Referring to FIG. 17, a method 1700 is illustrated for performing antenna selection according to transmission measurements. Method 1700 can operate utilizing an antenna plane delta. At 1702, At 1702, connect the LB Main tuner to the coupler. At 1704, perform coarse tuning, such as to improve or optimize the match. At 1706, measure any coupling to the MB/HB1 and/or MB/HB2 antennas. At 1710, connect the LB diversity tuner to the coupler. At 1712, perform coarse tuning. At 1714, measure any coupling to the MB/HB1 and/or MB/HB2 antennas. At 1716, determine which antenna has least absorption and based the antenna selection on this determination.

Figure 18:
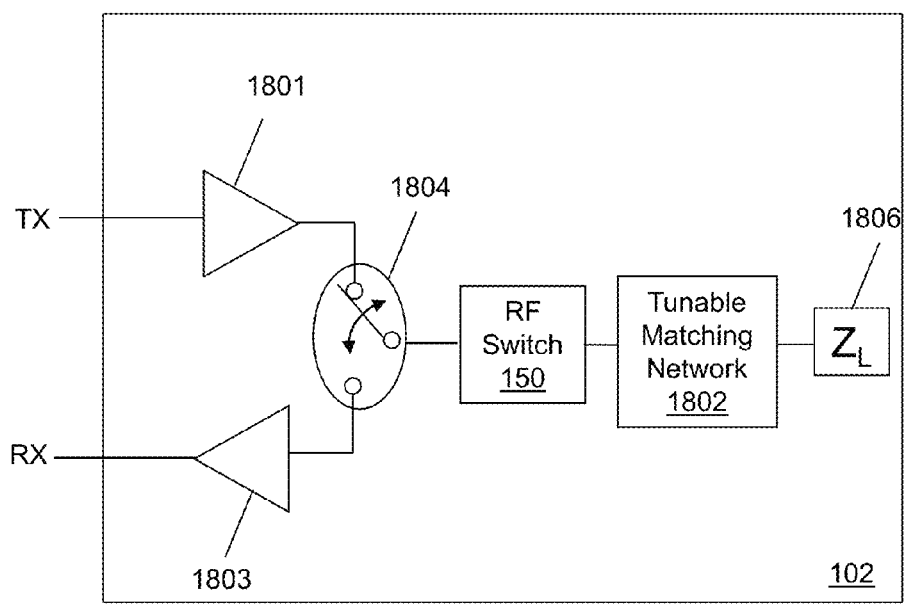
FIG. 18 depicts an illustrative embodiment of a portion of a transceiver of the communication device of FIG. 1.

FIG. 18 depicts an illustrative embodiment of a portion of the wireless transceiver 102 of the communication device 100 of FIG. 1. In GSM applications, the transmit and receive portions of the transceiver 102 can include amplifiers 1801, 1803 coupled to a tunable matching network 1802 that is in turn coupled to an impedance load 1806 (which can be one or more antennas including primary and diversity antennas). Antenna switching, via switch 150, can be performed based on operational parameters associated with one, some, or all of the antennas, such as based on reflection measurements.

In one or more embodiments, a full duplex configuration without switch 1804 can be utilized such as for an LTE or WCDMA application. The tunable matching network 1802 can include all or a portion of the tuning circuit 122 of FIG. 1, such as variable capacitors to enable high linearity tuning while satisfying performance criteria such as insertion loss thresholds and/or response time speed. The impedance load 1806 in the present illustration can be all or a portion of the antenna system (e.g., reconfigurable via RF switch 150) as shown in FIG. 1 (herein antenna 1806). In one or more embodiments, the RF switch 150 can be on the Tx/Rx side of the matching network(s) 1802. In another embodiment, a separate matching network 1802 can be used for each antenna. A transmit signal in the form of a radio frequency (RF) signal (TX) can be directed to the amplifier 1801 which amplifies the signal and directs the amplified signal to the antenna 1806 by way of the tunable matching network 2018 when switch 1804 is enabled for a transmission session. The receive portion of the transceiver 102 can utilize a pre-amplifier 1803 which amplifies signals received from the antenna 1806 by way of the tunable matching network 1802 when switch 1804 is enabled for a receive session. Other configurations of FIG. 18 are possible for other types of cellular access technologies such as CDMA, UMTS, LTE, and so forth. The exemplary embodiments are applicable to all types of radio technologies including WiFi, GPS and so forth, and are not intended to be limited to cellular access technologies. These undisclosed configurations are applicable to the subject disclosure.

Figure 19:
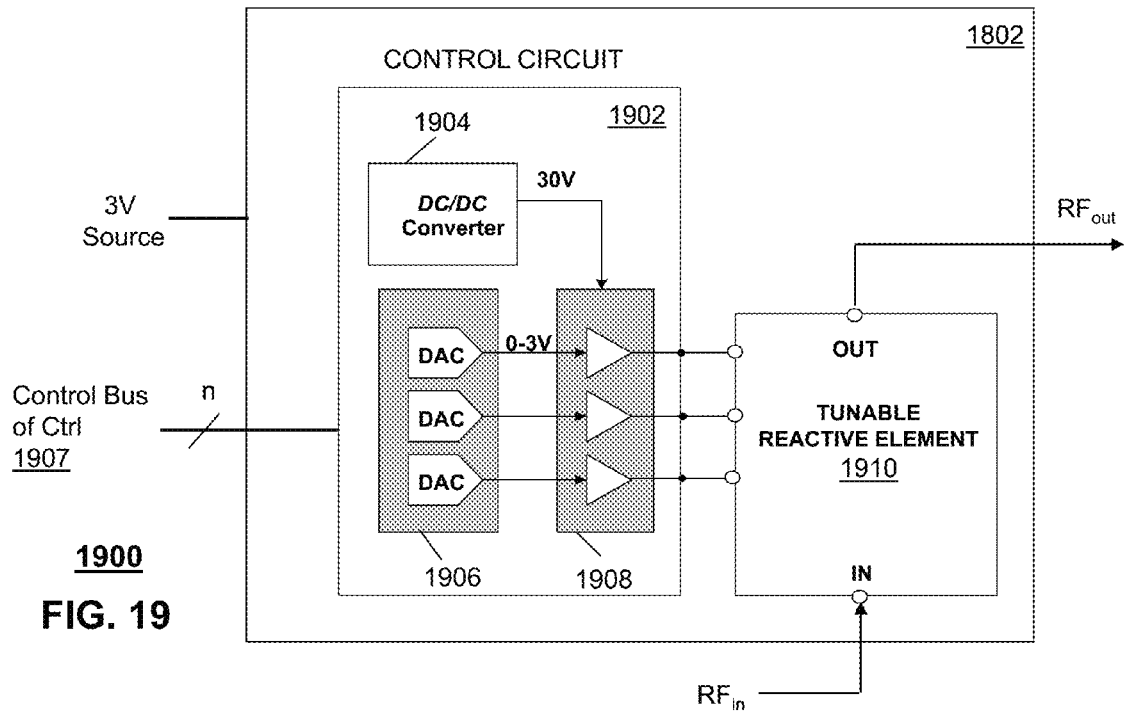
FIGS. 19-22 depict illustrative embodiments of a tunable matching network of the transceiver of FIG. 8.
Figure 20:
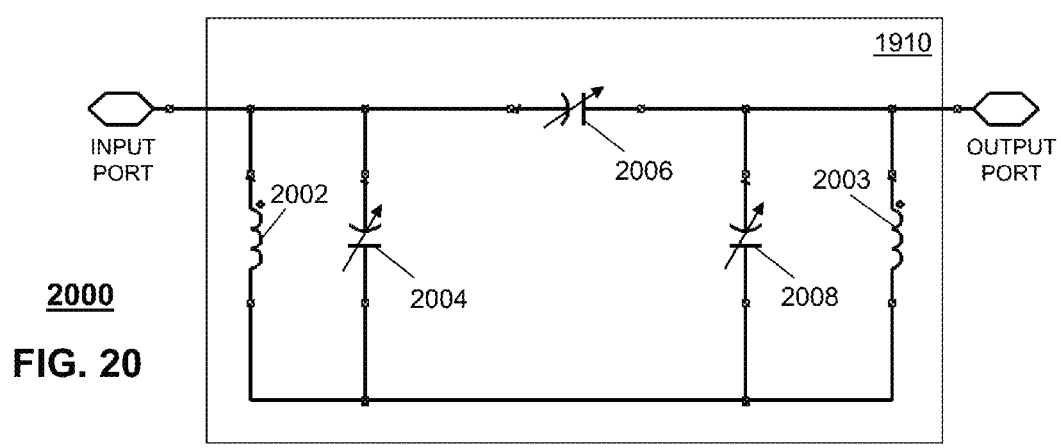

FIGS. 19-20 depict illustrative embodiments of the tunable matching network 1802 of the transceiver 102 of FIG. 18. In one embodiment, the tunable matching network 1802 can comprise a control circuit 302 and a tunable reactive element 1910. The control circuit 1902 can comprise a DC-to-DC converter 1904, one or more digital to analog converters (DACs) 1906 and one or more corresponding buffers 1908 to amplify the voltage generated by each DAC. The amplified signal can be fed to one or more tunable reactive components 404, 406 and 408 such as shown in FIG. 4, which depicts a possible circuit configuration for the tunable reactive element 310. In this illustration, the tunable reactive element 310 includes three tunable capacitors 2004-2008 and two inductors 2002-2003 with a fixed inductance. Circuit configurations such as "Tee", "Pi", and "L" configurations for a matching circuit are also suitable configurations that can be used in the subject disclosure.

The tunable capacitors 2004-2008 can each utilize technology that enables tunability of the reactance of the component. One embodiment of the tunable capacitors 2004-2008 can utilize voltage or current tunable dielectric materials. The tunable dielectric materials can utilize, among other things, a composition of barium strontium titanate (BST). In another embodiment, the tunable reactive element 310 can utilize semiconductor varactors, or microelectromechanical systems (MEMS) technology capable of mechanically varying the dielectric constant of a capacitor. Other present or next generation methods or material compositions that result in a voltage or current tunable reactive element are applicable to the subject disclosure for use by the tunable reactive element 1910 of FIG. 19.

The DC-to-DC converter 1904 can receive a DC signal such as 3 volts from the power supply 114 of the communication device 100 in FIG. 1A. The DC-to-DC converter 1904 can use technology to amplify a DC signal to a higher range (e.g., 30 volts) such as shown. The controller 106 can supply digital signals to each of the DACs 1906 by way of a control bus 1907 of "n" or more wires or traces to individually control the capacitance of tunable capacitors 2004-2008, thereby varying the collective reactive impedance of the tunable matching network 202. The control bus 1907 can be implemented with a two-wire serial bus technology such as a Serial Peripheral Interface (SPI) bus (referred to herein as SPI bus 1907). With an SPI bus 1907, the controller 106 can transmit serialized digital signals to configure each DAC in FIG. 19. The control circuit 1902 of FIG. 19 can utilize digital state machine logic to implement the SPI bus 1907, which can direct digital signals supplied by the controller 106 to the DACs to control the analog output of each DAC, which is then amplified by buffers 1908. In one embodiment, the control circuit 1902 can be a stand-alone component coupled to the tunable reactive element 1910. In another embodiment, the control circuit 1902 can be integrated in whole or in part with another device such as the controller 106.

Although the tunable reactive element 1910 is shown in a unidirectional fashion with an RF input and RF output, the RF signal direction is illustrative and can be interchanged. Additionally, either port of the tunable reactive element 1910 can be connected to a feed point of the antenna 1806, a structural element of the antenna 1806 in an on-antenna configuration, or between antennas for compensating mutual coupling when diversity antennas are used, or when antennas of differing wireless access technologies are physically in close proximity to each other and thereby are susceptible to mutual coupling. The tunable reactive element 1910 can also be connected to other circuit components of a transmitter or a receiver section such as filters, amplifiers, and so on, to control operations thereof.

Figure 22:
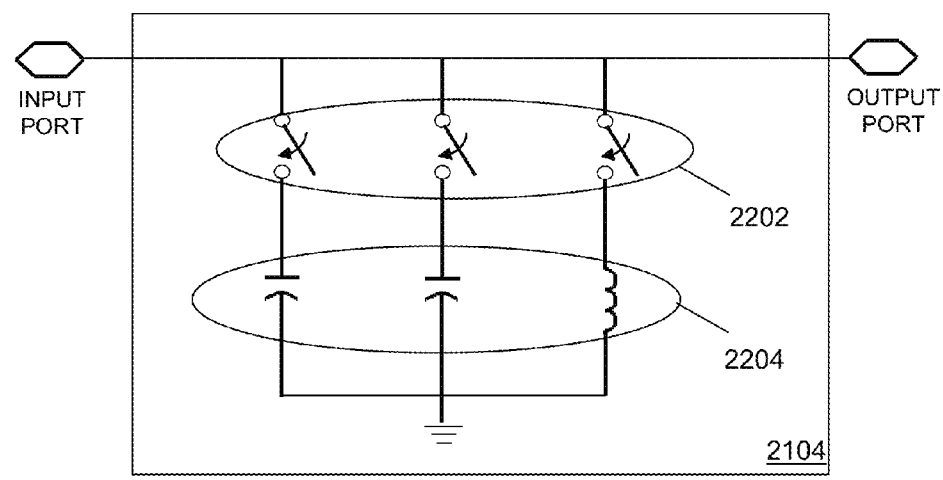

In another embodiment, the tunable matching network 1802 of FIG. 18 can comprise a control circuit 2102 in the form of a decoder and a tunable reactive element 2104 comprising switchable reactive elements such as shown in FIG. 6. In this embodiment, the controller 106 can supply the control circuit 2102 signals via the SPI bus 1907, which can be decoded with Boolean or state machine logic to individually enable or disable the switching elements 2202. The switching elements 2202 can be implemented with semiconductor switches, MEMS, or other suitable switching technology. By independently enabling and disabling the reactive elements 2204 (capacitor or inductor) of FIG. 22 with the switching elements 2202, the collective reactive impedance of the tunable reactive element 2104 can be varied by the controller 106.

Figure 21:
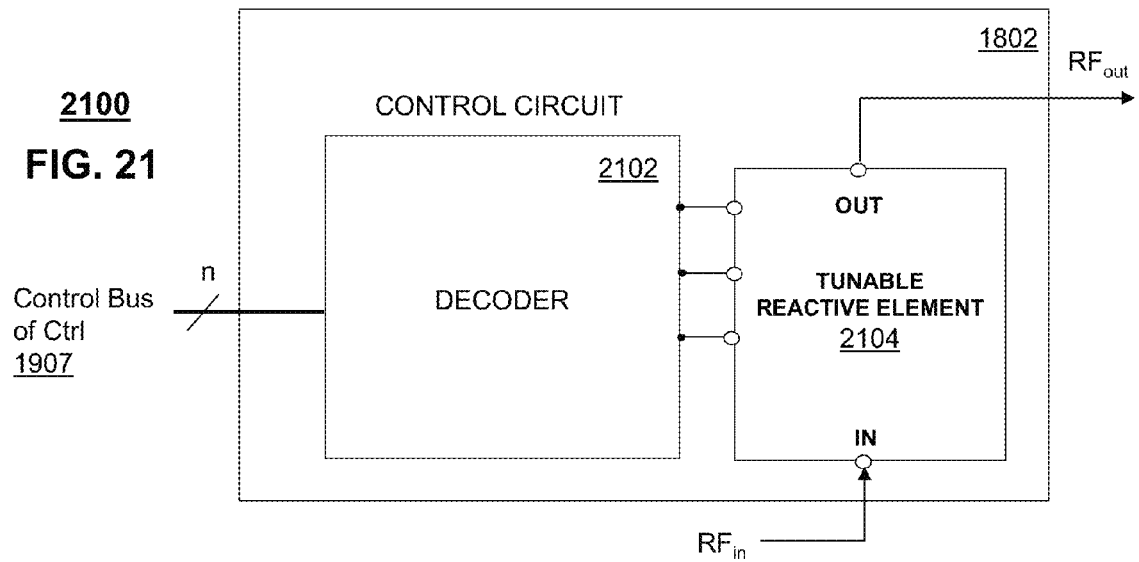

The tunable reactive elements 1910 and 2104 of FIGS. 19 and 21, respectively, can be used with various circuit components of the transceiver 102 to enable the controller 106 to manage performance factors such as, for example, but not limited to, transmit power, transmitter efficiency, receiver sensitivity, power consumption of the communication device 100, frequency band selectivity by adjusting filter passbands, linearity and efficiency of power amplifiers, SAR requirements, among other operational parameters.

Figure 24:
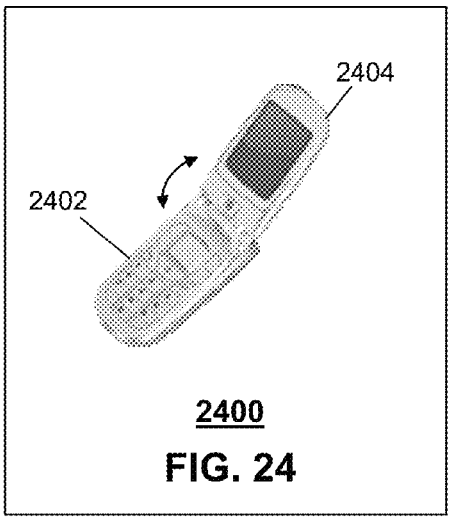
FIGS. 24-27 depict illustrative physical and operational use cases of a communication device.

FIG. 23 depicts an illustration of a look-up table stored in memory, which can be indexed by the controller 106 of the communication device 100 of FIG. 1 according to physical and/or functional use cases of the communication device 100. The desired tuning state can include values for the biasing signals and/or capacitance values to be employed for tuning of the variable capacitors, such as BST variable capacitors. A physical use case can represent a physical state of the communication device 100, while a functional use case can represent an operational state of the communication device 100. For example, for a flip phone 2400 of FIG. 24, an open flip can represent one physical use case, while a closed flip can represent another physical use case. In a closed flip state (i.e., bottom and top flips 2402-2404 are aligned), a user is likely to have his/her hands surrounding the top flip 2404 and the bottom flip 2402 while holding the phone 2400, which can result in one range of load impedances experienced by an internal or retrievable antenna (not shown) of the phone 2400. The range of load impedances of the internal or retrievable antenna can be determined by empirical analysis.

With the flip open a user is likely to hold the bottom flip 2402 with one hand while positioning the top flip 2404 near the user's ear when an audio system of the phone 2400, such audio system 112 of FIG. 1, is set to low volume, and voice channel is active. If, on the other hand, the audio system 112 is in speakerphone mode, it is likely that the user is positioning the top flip 2404 away from the user's ear. In these arrangements, different ranges of load impedances can be experienced by the internal or retrievable antenna, which can be analyzed empirically. The low and high volume states of the audio system 112, as well as, a determination that a voice channel is active, illustrates varying functional use cases.

Figure 25:
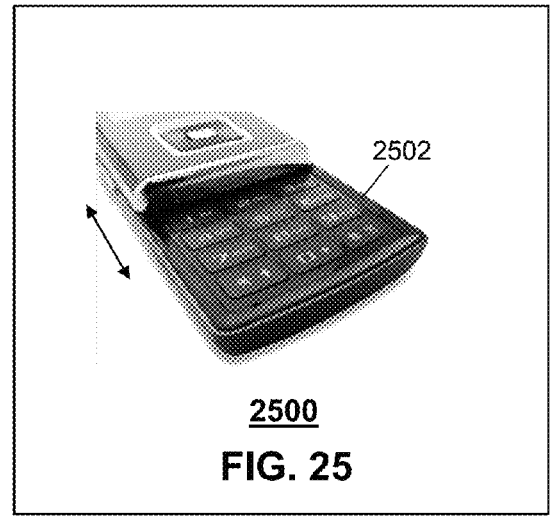
Figure 26:
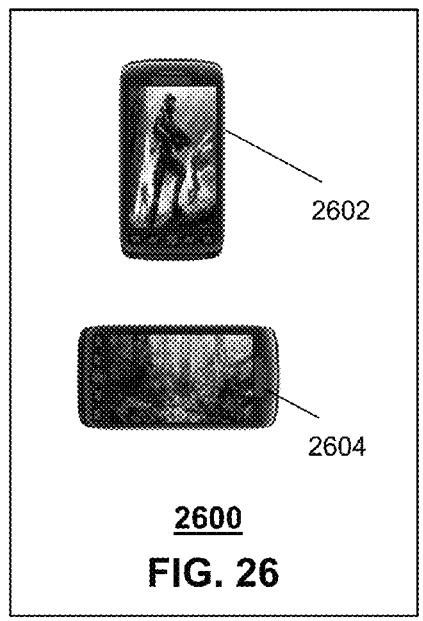
Figure 27:
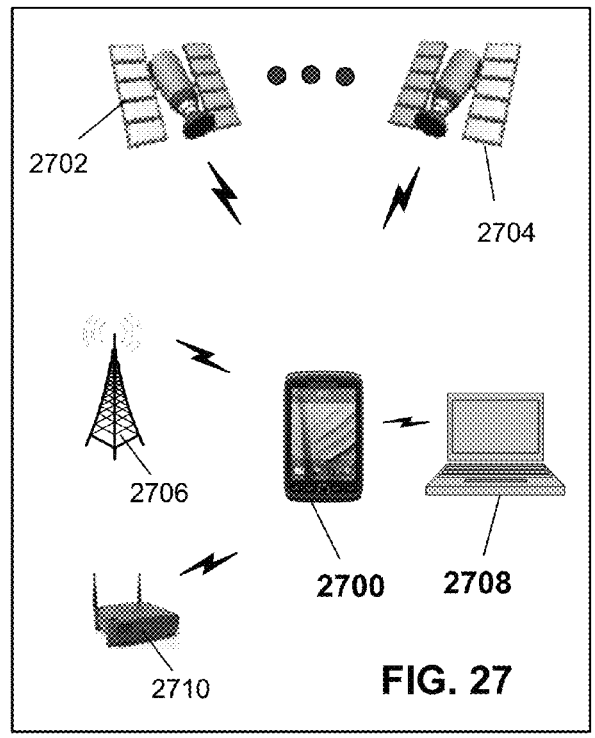

For a phone 2500 with a slideable keypad 2504 (illustrated in FIG. 25), the keypad in an outward position can present one range of load impedances of an internal antenna, while the keypad in a hidden position can present another range of load impedances, each of which can be analyzed empirically. For a smartphone 2600 (illustrated in FIG. 26) presenting a video game, an assumption can be made that the user is likely to hold the phone away from the user's ear in order to view the game. Placing the smartphone 2600 in a portrait position 2602 can represent one physical and operational use case, while utilizing the smartphone 2600 in a landscape position 1004 presents another physical and operational use case.

The number of hands and fingers used in the portrait mode may be determined by the particular type of game being played by the user. For example, a particular video game may require a user interface where a single finger in portrait mode may be sufficient for controlling the game. In this scenario, it may be assumed that the user is holding the smartphone 2600 in one hand in portrait mode and using a finger with the other. By empirical analysis, a possible range of impedances of the internal antenna(s) of the communication device can be determined when using the video game in portrait mode. Similarly, if the video game selected has a user interface that is known to require two hands in landscape mode, another estimated range of impedances of the internal antenna can be determined empirically.

A multimode phone 2700 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 2700. For example, a multimode phone 2700 that provides GPS services by processing signals received from a constellation of satellites 2702, 2704 can be empirically analyzed when other access technologies are also in use.

Suppose, for instance, that while navigation services are enabled, the multimode phone 2700 is facilitating voice communications by exchanging wireless messages with a cellular base station 2706. In this state, an internal antenna of the GPS receiver may be affected by a use case of a user holding the multimode phone 2700 (e.g., near the user's ear or away from the user's ear). The effect on the GPS receiver antenna and the GSM antenna by the user's hand position can be empirically analyzed.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 2700 (e.g., slider out), which can result in a probable hand position of the user of the multimode phone 2700. Such a physical and functional use case can affect the impedance range of the antenna of the WiFi transceiver as well as the antenna of the GSM transceiver.

A close proximity between the WiFi and GSM antennas and the near operational frequency of the antennas may also result in cross-coupling between the antennas. Mutual or cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 2708 or with a wireless access point 2710. In diversity designs such as multiple-input and multiple output (MIMO) antennas, physical and functional use cases of a communication device can be measured empirically to determine how best to configure a tunable compensation circuit 122 such as shown in FIG. 1.

The number of physical and functional use cases of a communication device 100 can be substantial when accounting for combinations of access technologies, frequency bands, antennas of different access technologies, antennas configured for diversity designs, and so on. These combinations, however, can be empirically analyzed to determine load impedances of the antenna(s), mutual coupling between them, and the effects on transmitter and receiver performance metrics. Mitigation strategies to reduce mutual coupling, counter the effect of varying load impedances, and to improve other performance metrics of the transceiver 102 can also be determined empirically. The empirical data collected and corresponding mitigation strategies can be recorded in the look-up table of FIG. 23 and indexed according to combinations of physical and functional use cases detected by the communication device 100. The information stored in the look-up table can be used in open-loop RF tuning applications to initialize tunable circuit components of the transceiver 102, as well as, tuning algorithms that control operational aspects of the tunable circuit components.

In one or more embodiments, information in the look-up table of FIG. 23 can be used for impedance tuning in conjunction with re-configuring or switching the primary and diversity antennas.

Other embodiments can be applied to the subject disclosure without departing from the scope of the claims described below.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Radio band information can be generally available or otherwise retrievable in communication devices, which provides the broadest definition of where in a frequency spectrum a communication device such as a handset is operating (e.g., transmitting). In communication systems (e.g., cellular systems), frequencies can be commonly allocated for usage in a block or range of frequencies. This block or range of frequencies is commonly known as a radio band. Multiple radio bands can be present in any given cellular system, and in any geographic location there can be multiple cellular systems present.

A radio channel can identify a discrete set of frequencies in a cellular system that contains the downlink (from base station to the handset) and uplink (from handset to base station) radio signals. Downlink is also referred to as Rx and uplink is also referred to as Tx. In most systems, such as WCDMA (Wideband Code Division Multiple Access), uplink and downlink can use separate frequencies that are separated by the duplex distance, which is the number of Hz separating the uplink and downlink paths. For other systems, such as TD-LTE (Time Division Long Term Evolution), the uplink and downlink can use the same frequency.

One or more of the exemplary embodiments can utilize radio band information, including only radio band information in some embodiments or radio band information in combination with other information (e.g., measured operational parameters), for antenna tuning. The exemplary embodiments can apply to various types of devices, including wireless handsets operating utilizing one or more of various communication protocols.

RF tuning based on limited information, such as only the radio band, can create a number of problems. In an ideal cellular system that employs RF tuning, the tuner would be set to match every frequency on which the radio receives or transmits, with the understanding that typically a single antenna is used for both Rx and Tx which requires the RF tuner to change tuning state as the RF signal on the antenna changes frequency. For half-duplex systems, such as GSM that would be for every Rx and Tx, including neighbor cells. In full-duplex systems, such as WCDMA where both Rx and Tx are present concurrently, the RF tuner has to change when the frequency changes for handoffs and neighbor cell monitoring, and additionally the tuning state has to be a duplex setting for Rx and Tx on a frequency between the Rx and Tx frequencies.

In order to perform RF tuning in such an ideal system, the entity controlling the tuner could require exact knowledge in real time of all relevant information pertaining to operating the tuner, such as the radio timing, radio band, radio channel, RF duplex information, and transmit state. Tuning based on limited information occurs when the entity controlling the tuner does not have all the information required to set the RF tuner to match an exact frequency at a given time. For example, real time channel information could be missing, in which case the tuner control entity could set the RF tuner based on information pertaining to the Radio Band only.

Transmit (Tx) and Receive (Rx) operations often cannot or are not tuned in real-time. This can result in or necessitate a broader duplex type tuning Duplex tuning refers to where the tunable element for a particular sub-band or radio channel is tuned to a frequency between uplink and downlink; one tuning state can be used for both Rx and Tx in this case. In some systems that are full-duplex (concurrent uplink and downlink, such as WCDMA), duplex tuning is commonly used. Other systems that are half-duplex (uplink and downlink are not concurrent, such as GSM), the tuner can be tuned for both Rx and Tx.

Sub-band describes a grouping of frequencies (e.g., radio channels) consisting of one or more radio channels. In tuning applications, sub-dividing a radio band into multiple sub-bands can provide the advantage of being able to apply a particular tuning state to a small or smaller range of radio channels. Sub-bands can be used in conjunction with storage and application of calibration data in cellular handsets, providing a compromise between accuracy and amount of storage needed to hold said calibration data.

An example of a radio band is the GSM 900 band, in which the uplink frequencies can occupy the range 880.0 to 915.0 MHz and the downlink frequencies can occupy the range 925.0 to 960.0 MHz. The duplex spacing can be 45 MHz. The first channel can be channel 975 which has uplink at 880.2 MHz and downlink at 915.2 MHz. The last channel can be channel 124 which has uplink at 914.8 MHz and downlink at 959.8 MHz.

The GSM 900 band can, for example, be subdivided into 3 sub bands as follows: Sub band 1 ranging from channel 975 to channel 1023 (48 channels, 9.6 MHz wide), Sub Band 2 ranging from channel 0 to channel 66 (66 channels, 13.2 MHz wide), and sub band 3 ranging from channel 67 to channel 124 (57 channels, 11.4 MHz wide). This is an example of a radio band and sub-bands, and the present disclosure can include various configurations of radio bands and sub-bands.

Similar principles can be applied to other existing wireless access technologies (e.g., UMTS, etc.) as well as future generation access technologies.

Figure 28:
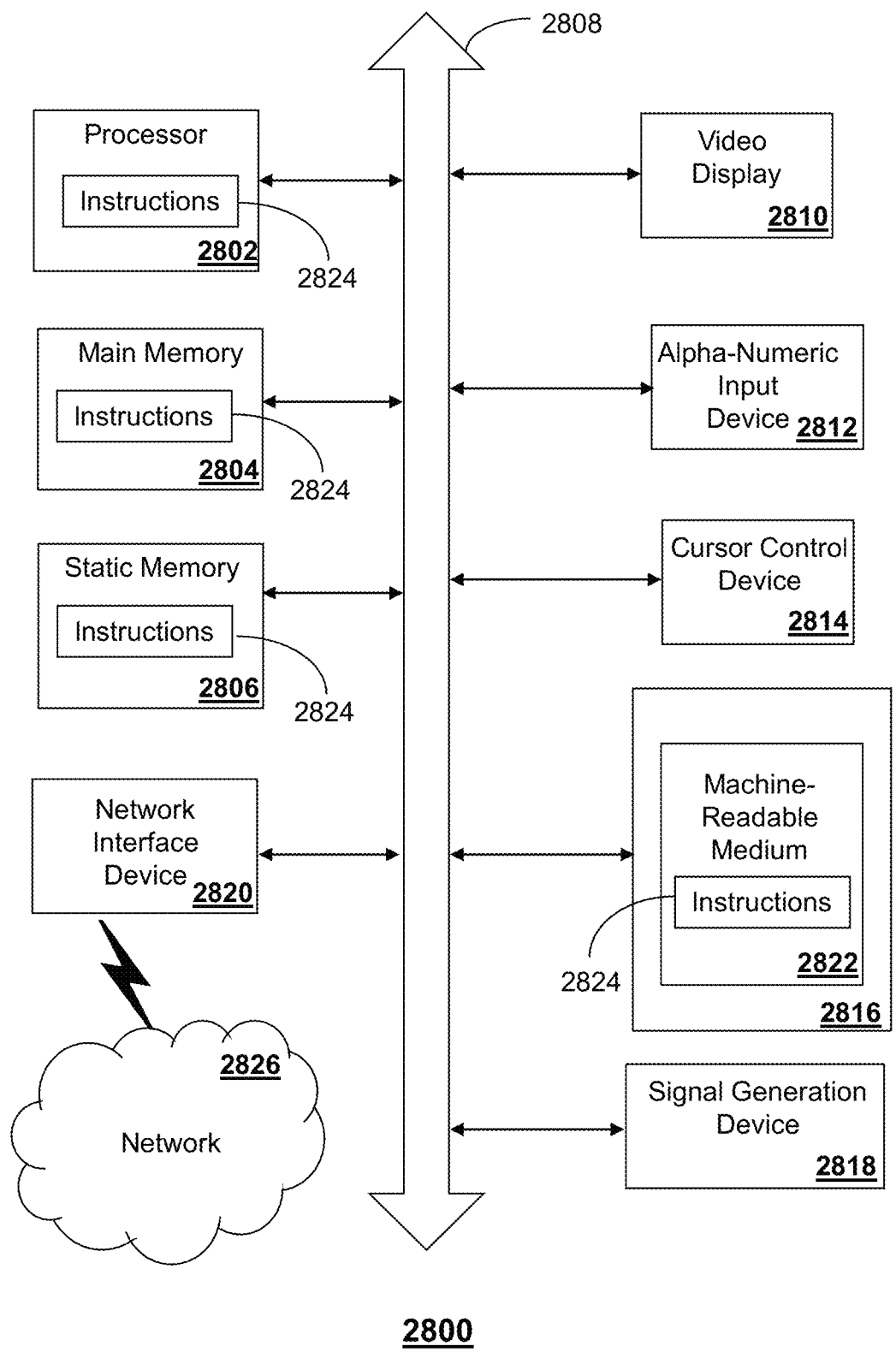
FIG. 28 depicts an illustrative diagrammatic representation of a machine in the form of a computer system within which a set of instructions, when executed, may cause the machine to perform any one or more of the methodologies disclosed herein.

FIG. 28 depicts an exemplary diagrammatic representation of a machine in the form of a computer system 2800 within which a set of instructions, when executed, may cause the machine to perform any one or more of the methods discussed above. One or more instances of the machine can operate, for example, as the communication device 100 or other devices described herein for performing antenna selection and/or impedance tuning in a multi-antenna device. In some embodiments, the machine may be connected (e.g., using a network 2826) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 2800 may include a processor (or controller) 2802 (e.g., a central processing unit (CPU), a graphics processing unit (GPU, or both), a main memory 2804 and a static memory 2806, which communicate with each other via a bus 2808. The computer system 2800 may further include a display unit 2810 (e.g., a liquid crystal display (LCD), a flat panel, or a solid state display. The computer system 2800 may include an input device 2812 (e.g., a keyboard), a cursor control device 2814 (e.g., a mouse), a disk drive unit 2816, a signal generation device 2818 (e.g., a speaker or remote control) and a network interface device 2820. In distributed environments, the embodiments described in the subject disclosure can be adapted to utilize multiple display units 2810 controlled by two or more computer systems 2800. In this configuration, presentations described by the subject disclosure may in part be shown in a first of the display units 2810, while the remaining portion is presented in a second of the display units 2810.

The disk drive unit 2816 may include a tangible computer-readable storage medium 2822 on which is stored one or more sets of instructions (e.g., software 2824) embodying any one or more of the methods or functions described herein, including those methods illustrated above. The instructions 2824 may also reside, completely or at least partially, within the main memory 2804, the static memory 2806, and/or within the processor 2802 during execution thereof by the computer system 2800. The main memory 2804 and the processor 2802 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 2822 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 2800.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, can be used in the subject disclosure. In one or more embodiments, features that are positively recited can also be excluded from the embodiment with or without replacement by another component or step. The steps or functions described with respect to the exemplary processes or methods can be performed in any order. The steps or functions described with respect to the exemplary processes or methods can be performed alone or in combination with other steps or functions (from other embodiments or from other steps that have not been described). Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can include virtual processor(s). The processor can include a state machine, application specific integrated circuit, and/or programmable gate array including a Field PGA, or state machine. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A mobile communication device, comprising:
a transceiver;
an antenna system coupled with the transceiver, wherein the antenna system includes a first antenna and a second antenna, wherein one of the first or second antennas is operating as a primary antenna and another of the first or second antennas is operating as a diversity antenna;
an RF switch connected with the antenna system, wherein the RF switch has a first position in which the first antenna is the primary antenna and the second antenna is the diversity antenna, and wherein the RF switch has a second position in which the second antenna is the primary antenna and the first antenna is the diversity antenna;
a matching network coupled with the transceiver and the antenna system, wherein the matching network comprises a tunable reactive element; and
a controller coupled with the matching network and with the RF switch, wherein the controller receives first reflection measurements associated with the antenna system, wherein the controller adjusts the tunable reactive element according to the first reflection measurements to provide impedance tuning, wherein the controller adjusts the RF switch to select between the first and second positions according to the first reflection measurements,
wherein the controller adjusts the RF switch to select between the first and second positions according to the first reflection measurements and a distance measured from free space designated on a stored tuning grid.

2. The mobile communication device of claim 1, further comprising a modem, wherein the controller adjusts the RF switch to select between the first and second positions during a time period in which the modem enables an antenna switch.

3. The mobile communication device of claim 1, wherein the first reflection measurements are limited to one of the first or second antennas.

4. The mobile communication device of claim 1, wherein the RF switch is in the first position, wherein the first reflection measurements are limited to the first antenna, wherein the controller adjusts the RF switch to select the second position according to the first reflection measurements, wherein the controller receives second reflection measurements that are limited to the second antenna, wherein the controller adjusts the tunable reactive element according to the second reflection measurements to provide the impedance tuning.

5. The mobile communication device of claim 4, wherein the controller adjusts the RF switch to select the first position according to the second reflection measurements.

6. The mobile communication device of claim 1, wherein the controller adjusts the RF switch to select between the first and second positions according to the first reflection measurements and a stored free space reference value.

7. The mobile communication device of claim 1, wherein the adjusting of the RF switch to select between the first and second positions is based on a stored efficiency value corresponding to a location on the tuning grid.

8. The mobile communication device of claim 1, wherein the impedance tuning is for the first and second antennas, wherein the tunable reactive element comprises a first tunable reactive element and a second tunable reactive element, wherein the first tunable reactive element performs the impedance tuning for the first antenna, and wherein the second tunable reactive element performs the impedance tuning for the second antenna.

9. A method comprising:
obtaining, by a controller of a communication device, first reflection measurements for a first antenna of the communication device operating as a primary antenna when an RF switch of the communication device is in a first position;
adjusting, by the controller, a tunable reactive element of a matching network according to the first reflection measurements to perform impedance tuning;
analyzing, by the controller, the first reflection measurements to determine a desired antenna for transmission;
switching, by the controller, the RF switch to a second position responsive to a determination that a second antenna of the communication device is the desired antenna for transmission, wherein the switching to the second position causes the second antenna to operate as the primary antenna;
obtaining, by the controller, second reflection measurements for the second antenna operating as the primary antenna when the RF switch is in the second position;
adjusting, by the controller, the tunable reactive element according to the second reflection measurements to perform the impedance tuning;
analyzing, by the controller, the second reflection measurements to determine the desired antenna for transmission; and
switching, by the controller, the RF switch to the first position responsive to a determination that the first antenna is the desired antenna for transmission,
wherein the controller adjusts the RF switch to select the second position according to the first reflection measurements and a stored efficiency value corresponding to a location on a two-dimensional tuning grid.

10. The method of claim 9, wherein the controller adjusts the RF switch to select between the first and second positions during a time period in which a modem of the communication device enables an antenna switch.

11. The method of claim 9, wherein the controller adjusts the RF switch to select the second position according to the first reflection measurements and a stored free space reference value.

12. The method of claim 9, wherein the adjusting of the RF switch to select the second position is based on a distance measured from free space designated on the two-dimensional tuning grid.

13. A communication device, comprising:
a modem;
a transceiver;
an antenna system coupled with the transceiver, wherein the antenna system includes a first antenna and a second antenna, wherein one of the first or second antennas is operating as a primary antenna and another of the first or second antennas is operating as a diversity antenna;
an RF switch connected with the antenna system, wherein the RF switch has a first position in which the first antenna is the primary antenna and the second antenna is the diversity antenna, and wherein the RF switch has a second position in which the second antenna is the primary antenna and the first antenna is the diversity antenna; and
a controller coupled with the RF switch, wherein the controller receives first reflection measurements associated with the antenna system, wherein the controller adjusts the RF switch to select between the first and second positions according to the first reflection measurements and during a time period in which the modem enables an antenna switch,
wherein the controller adjusts the RF switch to select between the first and second positions according to the first reflection measurements and a stored efficiency value corresponding to a location on a tuning grid.

14. The communication device of claim 13, further comprising a matching network coupled with the transceiver and the antenna system, wherein the matching network comprises a tunable reactive element, and wherein the controller adjusts the tunable reactive element according to the first reflection measurements to provide impedance tuning.

15. The communication device of claim 14, wherein the tunable reactive element comprises a first tunable reactive element coupled with the first antenna and a second tunable reactive element coupled with the second antenna, and wherein tuning values for the first and second tunable reactive elements are selected according to improving impedance tuning of a receive-only function of one of the first or second antennas and compromising impedance tuning between transmit and receive functions of ffthell another of the first or second antennas.

16. The communication device of claim 13, wherein the controller adjusts the RF switch to select between the first and second positions according to the first reflection measurements and one of a stored free space reference value or a distance measured from free space designated on a stored tuning grid.

17. The communication device of claim 13, wherein the controller receives sensed parameters associated with the communication device, wherein the adjusting of the RF switch to select between the first and second positions is according to the first reflection measurements and the sensed parameters, and wherein the sensed parameters include at least one of proximity data, first capacitive data associated with the antenna system, or second capacitive data associated with a touch screen.

* * * * *